United States Patent
Chang et al.

(10) Patent No.: US 9,319,036 B2
(45) Date of Patent: Apr. 19, 2016

(54) GATE SIGNAL ADJUSTMENT CIRCUIT

(75) Inventors: Shih Chang Chang, San Jose, CA (US); Ting-Kuo Chang, Hsinchu (TW); Abbas Jamshidi Roudbari, Sunnyvale, CA (US); Cheng-Ho Yu, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 2 days.

(21) Appl. No.: 13/112,862

(22) Filed: May 20, 2011

(65) Prior Publication Data

US 2012/0293485 A1 Nov. 22, 2012

(51) Int. Cl.
| | |
|---|---|
| *G06F 3/038* | (2013.01) |
| *H03K 5/12* | (2006.01) |
| *G09G 3/32* | (2006.01) |
| *G09G 3/36* | (2006.01) |

(52) U.S. Cl.
CPC ............. *H03K 5/12* (2013.01); *G09G 3/3266* (2013.01); *G09G 3/3677* (2013.01); *G09G 2330/06* (2013.01)

(58) Field of Classification Search
CPC .. G09G 3/3266; G09G 3/3674; G09G 3/3685
USPC ................... 345/204–215, 690–699
See application file for complete search history.

(56) References Cited

U.S. PATENT DOCUMENTS

| | | | |
|---|---|---|---|
| 5,483,261 A | 1/1996 | Yasutake | |
| 5,488,204 A | 1/1996 | Mead et al. | |
| 5,825,352 A | 10/1998 | Bisset et al. | |
| 5,835,079 A | 11/1998 | Shieh | |
| 5,880,411 A | 3/1999 | Gillespie et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,573,777 B2 | 6/2003 | Saint-Laurent et al. | |
| 6,630,717 B2 | 10/2003 | Ashida | |
| 6,690,387 B2 | 2/2004 | Zimmerman et al. | |

(Continued)

FOREIGN PATENT DOCUMENTS

| | | |
|---|---|---|
| JP | 2000-163031 A | 6/2000 |
| JP | 2002-342033 A | 11/2002 |
| KR | 2001-0062920 A | 7/2001 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

(Continued)

*Primary Examiner* — Gustavo Polo
(74) *Attorney, Agent, or Firm* — Morrison & Foerster LLP

(57) ABSTRACT

A gate signal adjustment circuit for a display is disclosed. The gate signal adjustment circuit can adjust a transition time of a gate signal used to drive data displaying. The adjustment can be to either speed up or slow down the transition time according to the requirements of the display. In an example, the gate signal adjustment circuit can include multiple transistors, where a first set of the transistors outputs the gate signal and a second set of the transistors outputs an adjustment to the gate signal. The second set of transistors can be the same or different sizes depending on the desirable number of adjustment options. The circuit can also include a control line coupled to the second set of transistors to control the adjustment output. Gate signal adjustment can reduce crosstalk in the display.

25 Claims, 18 Drawing Sheets

(56) References Cited

U.S. PATENT DOCUMENTS

| | | | |
|---|---|---|---|
| 7,015,894 | B2 | 3/2006 | Morohoshi |
| 7,184,064 | B2 | 2/2007 | Zimmerman et al. |
| 7,561,137 | B2 | 7/2009 | Fratti et al. |
| 7,663,607 | B2 | 2/2010 | Hotelling et al. |
| 7,795,922 | B2 | 9/2010 | Tomoeda et al. |
| 7,804,553 | B2 | 9/2010 | Chang |
| 7,859,707 | B2 | 12/2010 | Kuwano et al. |
| 8,479,122 | B2 | 7/2013 | Hotelling et al. |
| 2005/0083292 | A1 | 4/2005 | Moon et al. |
| 2006/0026521 | A1 | 2/2006 | Hotelling et al. |
| 2006/0197753 | A1 | 9/2006 | Hotelling |
| 2006/0279511 | A1* | 12/2006 | Uh et al. ............. 345/100 |
| 2008/0067528 | A1 | 3/2008 | Choi et al. |
| 2010/0309190 | A1* | 12/2010 | Hasegawa et al. ......... 345/212 |
| 2011/0199365 | A1* | 8/2011 | Umezaki et al. ......... 345/212 |
| 2012/0162121 | A1 | 6/2012 | Chang et al. |

OTHER PUBLICATIONS

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

Non-Final Office Action mailed Oct. 11, 2013, for U.S. Appl. No. 12/976,909, filed Dec. 22, 2010, 10 pages.

Final Office Action mailed Feb. 27, 2014, for U.S. Appl. No. 12/976,909, filed Dec. 22, 2010, 11 pages.

Non-Final Office Action mailed Jun. 16, 2014, for U.S. Appl. No. 12/976,909, filed Dec. 22, 2010, 18 pages.

Final Office Action mailed Nov. 26, 2014, for U.S. Appl. No. 12/976,909, filed Dec. 22, 2010, 16 pages.

\* cited by examiner

GATE SIGNAL ADJUSTMENT CIRCUIT

FIELD

This relates generally to displays and more particularly, to adjusting gate signals in displays to reduce crosstalk within the display.

BACKGROUND

Computing systems can use displays to provide information to users. The displayed information can be in the form of text, graphics, images, and the like. The quality of the display can be important. High display quality can provide a clear, aesthetically pleasing, and helpful user experience; whereas, low display quality can distract, annoy, and confuse the user. Display device performance can also be important. Fast start, change, and update of a display can be highly desirable.

Electrical interference from internal and external sources can adversely affect display quality and device performance by disrupting or otherwise interfering with signals within the display. Crosstalk is one such interference, where unwanted signals can transfer onto a display component from a proximate display component. Minimizing interference, such as crosstalk, in the display can be helpful.

SUMMARY

This relates to a gate signal adjustment circuit for a display. The gate signal adjustment circuit can adjust a transition time of a gate signal used to drive data displaying. The transition time can be the falling time, the rising time, or both of the gate signal. The adjustment can be to either speed up or slow down the transition time according to the requirements of the display. In an example, the gate signal adjustment circuit can include multiple transistors, where a first set of the transistors outputs the gate signal and a second set of the transistors outputs an adjustment to the gate signal. The second set of transistors can be the same or different sizes depending on the desirable number of adjustment options. The circuit can also include a control line coupled to the second set of transistors to control the adjustment output. The control line can output either an analog signal or a digital signal depending on the requirements of the display. In another example, the gate signal adjustment circuit can include the multiple transistors. The circuit can also include multiple control lines, each control line being coupled to a different transistor in the second set. The control lines can provide the same or different voltages. A gate signal adjustment circuit can advantageously improve display quality and device performance by reducing crosstalk in the display via gate signal adjustment.

DETAILED DESCRIPTION

In the following description of example embodiments, reference is made to the accompanying drawings in which it is shown by way of illustration specific embodiments that can be practiced. It is to be understood that other embodiments can be used and structural changes can be made without departing from the scope of the various embodiments.

This relates to a gate signal adjustment circuit for a display. The gate signal adjustment circuit can adjust a transition time of a gate signal used to drive data displaying. The transition time can be the falling time, the rising time, or both of the gate signal. The adjustment can be to either speed up or slow down the transition time according to the requirements of the display. In some embodiments, the gate signal adjustment circuit can include multiple transistors, where a first set of the transistors outputs the gate signal and a second set of the transistors outputs an adjustment to the gate signal. The second set of transistors can be the same or different sizes depending on the desirable number of adjustment options. The circuit can also include a control line coupled to the second set of transistors to control the adjustment output. The control line can output either an analog signal or a digital signal depending on the requirements of the display. In some embodiments, the gate signal adjustment circuit can include the multiple transistors. The circuit can also include multiple control lines, each control line being coupled to a different transistor in the second set. The control lines can provide the same or different voltages. A gate signal adjustment circuit can advantageously improve display quality and device performance by reducing crosstalk in the display via gate signal adjustment.

Although some embodiments are described herein in terms of a display, it is to be understood that other devices having a signal adjustment circuit can be used according to various embodiments.

Figure 1:
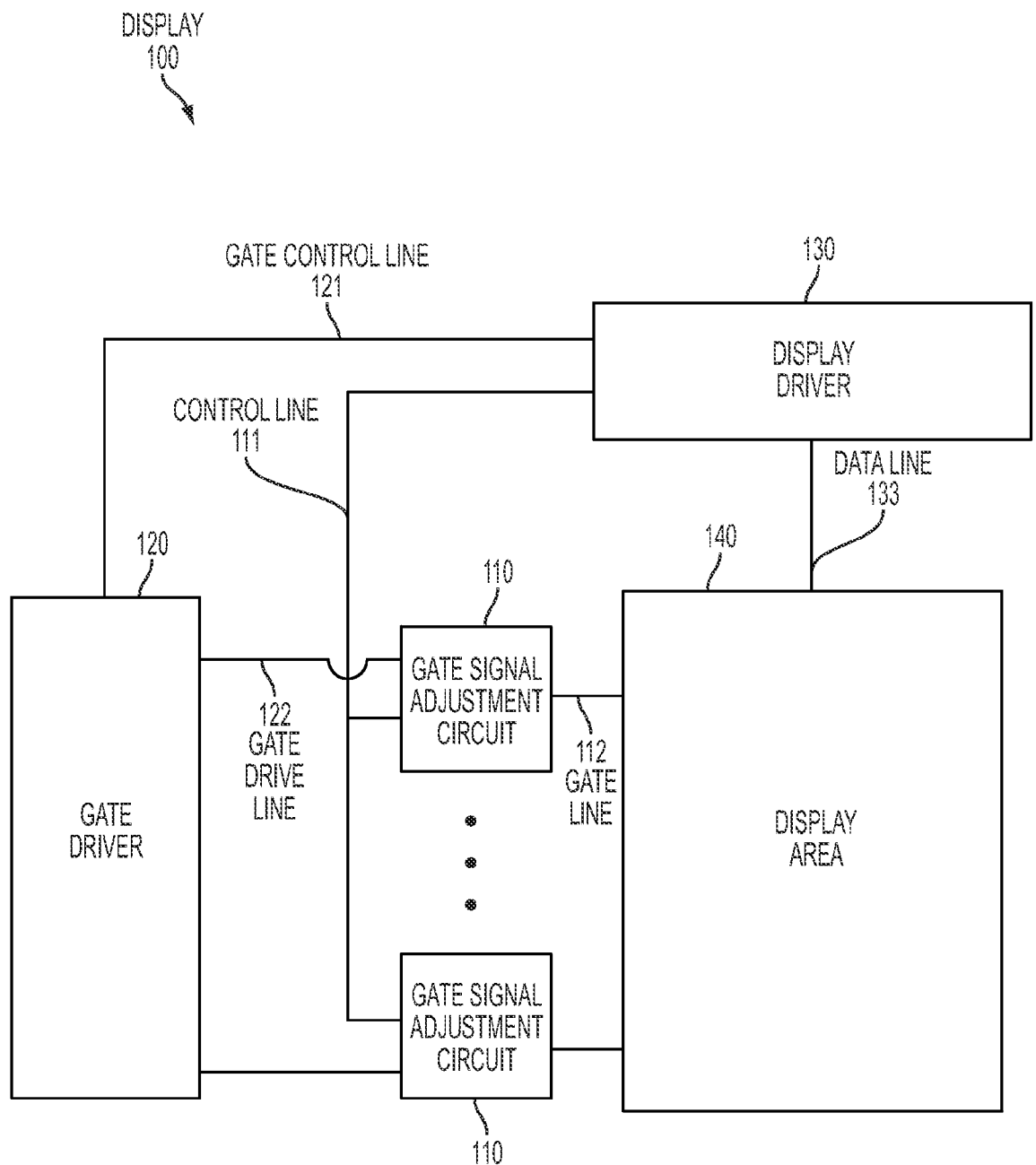
FIG. 1 illustrates an exemplary display having a gate signal adjustment circuit according to various embodiments.

FIG. 1 illustrates an exemplary display having a gate signal adjustment circuit according to various embodiments. In the example of FIG. 1, display 100 can include gate driver 120, one or more gate signal adjustment circuits 110, display driver 130, and display area 140. The gate driver 120 can be coupled to the gate signal adjustment circuits 110 via gate drive signal lines 122 to drive the circuits with gate drive signals. The gate signal adjustment circuits 110 can be coupled to the display area 140 via gate signal lines 112 to generate and adjust gate signals and to drive the display area with the adjusted gate signals. The display driver 130 can be coupled to the gate driver 120 via gate control lines 121 to control the gate driver, the gate signal adjustment circuits 110 via control lines 111 to control the circuits, and the display area 140 via data lines 133 to provide data to the display area.

During operation, the display driver 130 can transmit control signals along gate control lines 121 to cause the gate driver 120 to generate gate drive signals that can be used to drive the gate signal adjustment circuits 110. The gate drive signals can cause the gate signal adjustment circuits 110 to generate gate signals that can be used to drive the display area 140. The display driver 130 can transmit control signals along control lines 111 to cause the gate signal adjustment circuits 110 to make adjustments to the generated gate signals so as to reduce crosstalk in the display 100. The control signals from the display driver 130 to the gate signal adjustment circuits 110 can be analog, digital, or both, depending on the requirements of the display. In some embodiments, prior to display operation, the control signal voltages can be adjusted to fixed values based on the requirements of the display and/or the desired transition times of the gate signals. In some embodiments, the control signal voltages can be adjusted during display operation, based on the desired transition times of the gate signals and/or the amount of crosstalk in the display. In some embodiments, one control line 111 can be used to transmit the control signals to the gate signal adjustment circuits 110. In some embodiments, multiple control lines 111 can be used, where each control line can be coupled to separate components of the gate signal adjustment circuits 110. The gate signal adjustment circuits 110 can drive the display area 140 with adjusted or unadjusted gate signals transmitted via gate signal lines 112. The display driver 130 can provide data via data lines 133 to the display area 140. Upon receipt of the gate signals and the data, the display area 140 can display the data. This operation can be repeated each time the display 100 is updated with new data for displaying.

Adjustments to the gate signals by the gate signal adjustment circuits 110 can include adjustments to the falling time, rising time, or both of the gate signals. The adjustments can be to either speed up or slow down the falling time, the rising time, or both, so as to reduce crosstalk in the display, thereby improving display quality and performance.

Although FIG. 1 illustrates the gate signal adjustment circuits 110 on the left side of the display area 140, it is to be understood that the circuits can be on the right side of the display area or on both sides depending on the requirements of the display.

Figure 2:
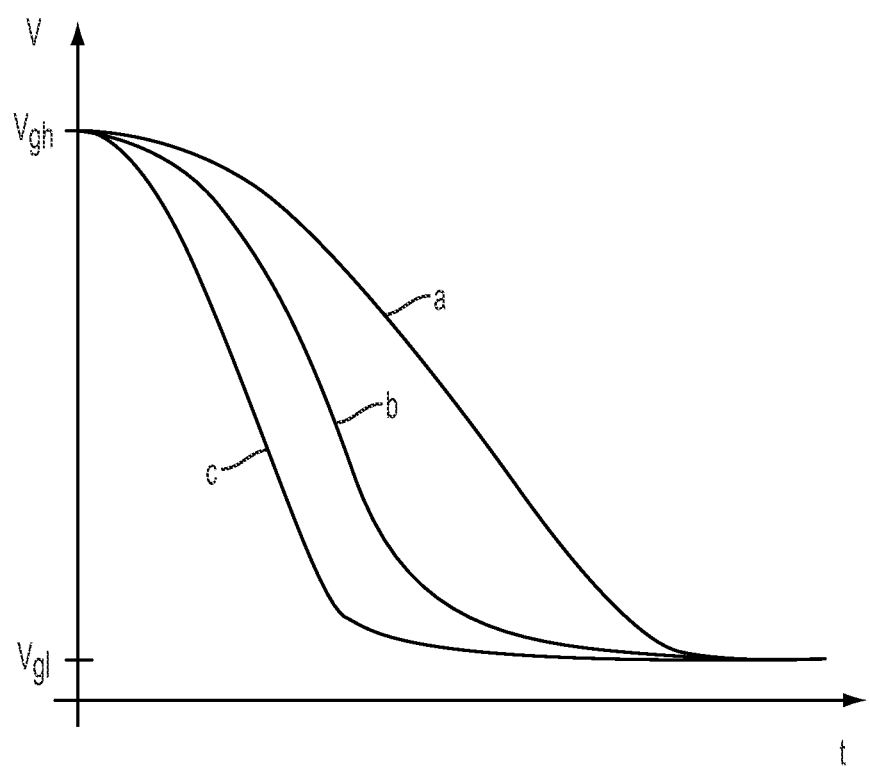
FIG. 2 illustrates an exemplary plot of various falling times of a display gate signal controlled according to various embodiments.

FIG. 2 illustrates an exemplary plot of various falling times of a display gate signal according to various embodiments. In the example of FIG. 2, gate signal a has a slower falling time from a high voltage Vgh to a low voltage Vgl, gate signal c has a faster falling time, and gate signal b has a falling time therebetween. A gate signal adjustment circuit can adjust the falling time of the gate signal to faster or slower, such as illustrated here, in order to reduce crosstalk in the display according to the requirements of the display. A similar plot can be shown for rising times of a display gate signal, where the rising times from a low voltage Vgl to a high voltage Vgh can be adjusted to be faster or slower in order to reduce crosstalk in the display.

Figure 3:
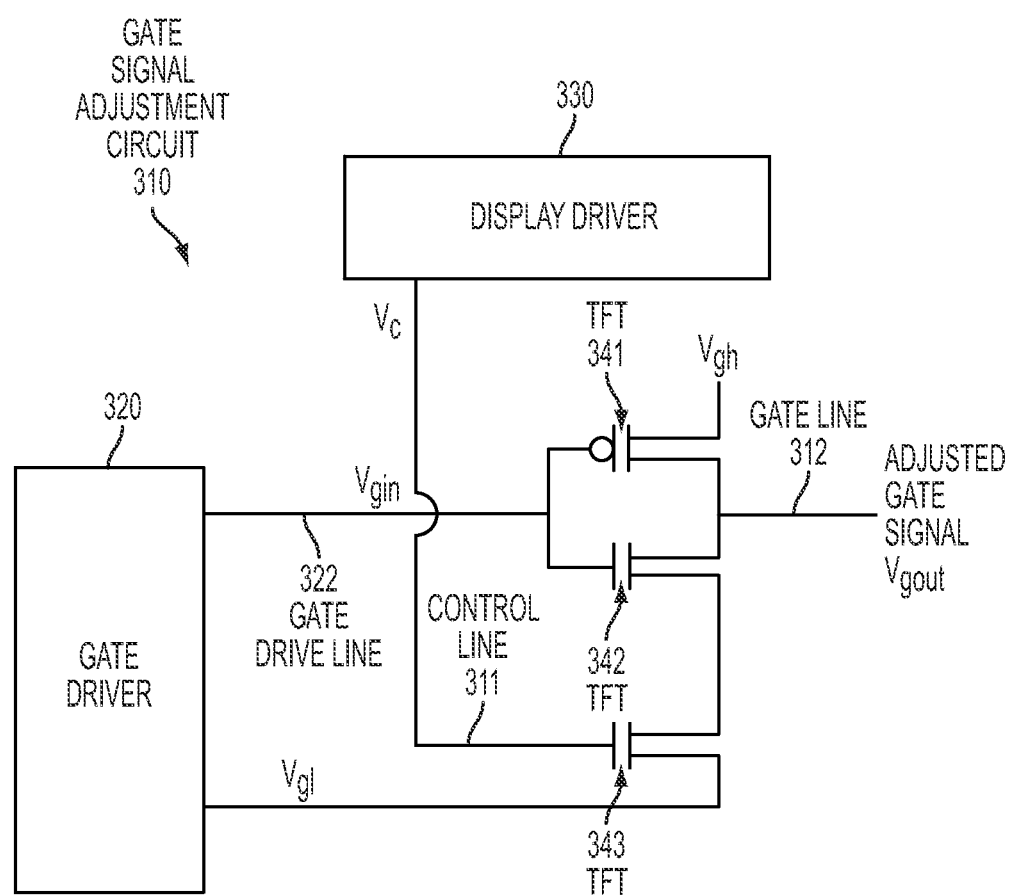
FIG. 3 illustrates an exemplary gate signal adjustment circuit according to various embodiments.

FIG. 3 illustrates an exemplary gate signal adjustment circuit according to various embodiments. In the example of FIG. 3, gate signal adjustment circuit 310 can include multiple thin film transistors (TFTs) 341, 342, 343 for receiving a gate drive signal from gate driver 320, generating a gate signal, adjusting the gate signal, and outputting the adjusted gate signal. The circuit 310 can also include control line 311 for receiving a control signal from display driver 330 to control the gate signal adjustment, input gate line 322 for receiving a gate drive signal from the gate driver 320, and output gate line 312 for sending an adjusted gate signal to the display area (not shown).

TFT 341 can be a p-type transistor with a gate terminal coupled to the input gate line 322 to receive and invert a gate drive signal from the gate driver 320, a source terminal coupled to a high voltage source Vgh from the gate driver, and a drain terminal coupled to the output gate line 312 to output either an unadjusted or an adjusted gate signal.

TFT 342 can be an n-type transistor with a gate terminal coupled to the input gate line 322 to receive a gate drive signal from the gate driver 320, a source terminal coupled to a drain terminal of TFT 343 to receive an adjustment signal, and a drain terminal coupled to the output gate line 312 to output an adjusted gate signal based on the received adjustment signal or to output an unadjusted gate signal.

TFT 343 can be an n-type transistor with a gate terminal coupled to the control line 311 to receive a control signal from the display driver 330, a source terminal coupled to a low voltage source Vgl from the gate driver 320, and a drain terminal coupled to the source terminal of TFT 342 to output the adjustment signal to TFT 342 for adjusting the gate signal.

The TFTs 341, 342, 343 can be single-gate or multi-gate structures. The control signals can be analog, digital, or both, depending on the requirements of the display. The voltage levels of the control signal can be adjustable according to the requirements of the display.

Although the TFTs are described in particular p-type and n-type configurations, it is to be understood that other TFT type configurations are also possible according to the requirements of the display. TFTs are examples of components that can be used to adjust signals in a display. However, other components are also possible according to the requirements of the display.

During operation, the gate signal adjustment circuit can have various operating conditions. Table 1 shows the various operating conditions of the control line signal Vc, which can affect adjustment of the gate signal.

TABLE 1

Operating conditions of gate signal adjustment circuit control line of FIG. 3.

| Vc |
|---|
| high |
| low |

For example, gate drive signal Vgin from the gate driver 320 can be either high or low and the control signal Vc from the display driver 330 can be either high or low, if digital, or a range of low-to-high voltages, if analog. In a high state, the signal Vgin can actuate TFT 342. Similarly, in a high state, the signal Vc can actuate TFT 343. As a result, TFT 343 can transmit low voltage Vgl to TFT 342, which can then output the signal Vgl as the adjusted gate signal Vgout. By virtue of the gate signal going through an additional TFT, i.e., TFT 343, rather than directly through TFT 342, the transition time of the gate signal can be desirably adjusted. In this example, the falling time of the gate signal can be adjusted.

Figure 4:
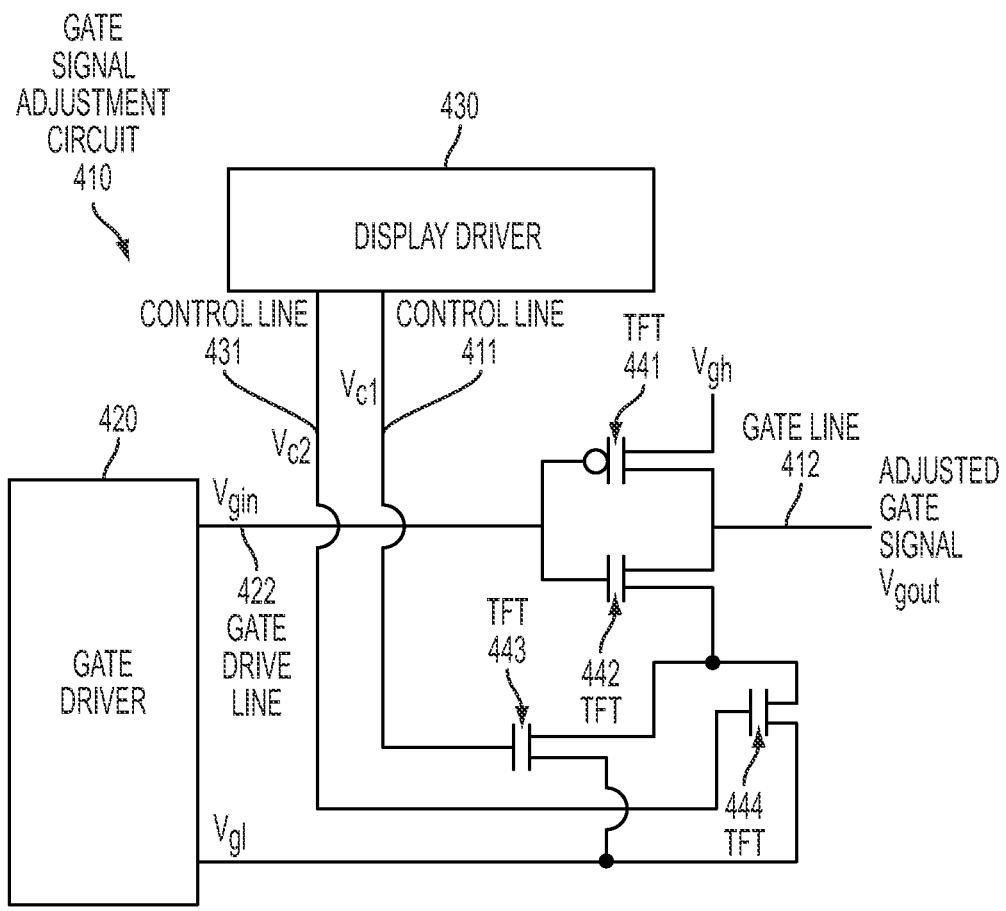
FIG. 4 illustrates another exemplary gate signal adjustment circuit according to various embodiments.

FIG. 4 illustrates another exemplary gate signal adjustment circuit according to various embodiments. In the example of FIG. 4, gate signal adjustment circuit 410 can include multiple thin film transistors (TFTs) 441, 442, 443, 444 for receiving a gate drive signal from gate driver 420, generating a gate signal, adjusting the gate signal, and outputting the adjusted gate signal. The circuit 410 can also include control lines 411, 431 for receiving control signals from display driver 430 to control the gate signal adjustment, input gate line 422 for receiving a gate drive signal from the gate driver 420, and output gate line 412 for sending an adjusted gate signal to the display area (not shown).

TFT 441 can be a p-type transistor with a gate terminal coupled to the input gate line 422 to receive and invert a gate drive signal from the gate driver 420, a source terminal coupled to a high voltage source Vgh from the gate driver, and a drain terminal coupled to the output gate line 412 to output either an unadjusted or an adjusted gate signal.

TFT 442 can be an n-type transistor with a gate terminal coupled to the input gate line 422 to receive a gate drive signal from the gate driver 420, a source terminal coupled to a drain terminal of TFTs 443, 444 to receive one or more adjustment signals, and a drain terminal coupled to the output gate line 412 to output an adjusted gate signal based on the received adjustment signal(s) or to output an unadjusted gate signal.

TFT 443 can be an n-type transistor with a gate terminal coupled to the control line 411 to receive a control signal from the display driver 430, a source terminal coupled to a low voltage source Vgl from the gate driver 420, and a drain terminal coupled to the source terminal of TFT 442 to output an adjustment signal to TFT 442 for adjusting the gate signal.

TFT 444 can be an n-type transistor in parallel with TFT 443 and can have a gate terminal coupled to the control line 431 to receive a control signal from the display driver 430, a source terminal coupled to a low voltage source Vgl from the gate driver 420, and a drain terminal coupled to the source terminal of TFT 442 to output an adjustment signal to TFT 442 for adjusting the gate signal.

The TFTs can be single-gate or multi-gate structures. Although the TFTs are described in particular p-type and n-type configurations, it is to be understood that other TFT type configurations are also possible according to the requirements of the display.

In some embodiments, TFTs 443, 444 can be different sizes to provide different adjustment signals to TFT 442 for adjusting the gate signal.

In some embodiments, the control signals can be digital, analog, or both.

Although two TFTs 443, 444 are shown in parallel here, it is to be understood that additional TFTs can be added in parallel to provide additional adjustment signal options according to the requirements of the display. For example, a third TFT can be added adjacent to TFT 444 to provide an adjustment signal to TFT 442 and a third control line can be added adjacent to control line 431 to control the third parallel TFT. Similar additions can be made for a fourth parallel TFT and control line, a fifth parallel TFT and control line, and so on.

During operation, the gate signal adjustment circuit can have various operating conditions. Table 2 shows various operating conditions of the control line signals Vc1, Vc2, which can affect adjustment of the gate signal.

TABLE 2

Operating conditions for gate signal adjustment circuit control lines of FIG. 4.

| Vc1 | Vc2 |
|---|---|
| high | high |
| low | high |
| high | low |
| low | low |

For example, gate drive signal Vgin from the gate driver 420 can be either high or low and the control signals Vc1, Vc2 from the display driver 430 can be either high or low, if digital, or a range of low-to-high voltages, if analog. In a high state, the signal Vgin can actuate TFT 442. Similarly, in a high state, the signal Vc1 can actuate TFT 443 and, in a high state, the signal Vc2 can actuate TFT 444. As a result, when both TFTs 443, 444 are actuated, they can transmit low voltage Vgl in parallel to TFT 442, which can then output the signal Vgl as the adjusted gate signal. Alternatively, when either TFT 443 or 444 is actuated, it can transmit low voltage Vgl to TFT 442, which can then output the signal Vgl as the adjusted gate signal Vgout. The adjustments can be different depending on whether one or both of TFT 443, 444 are actuated. In this example, the falling time of the gate signal can be adjusted.

Figure 5:
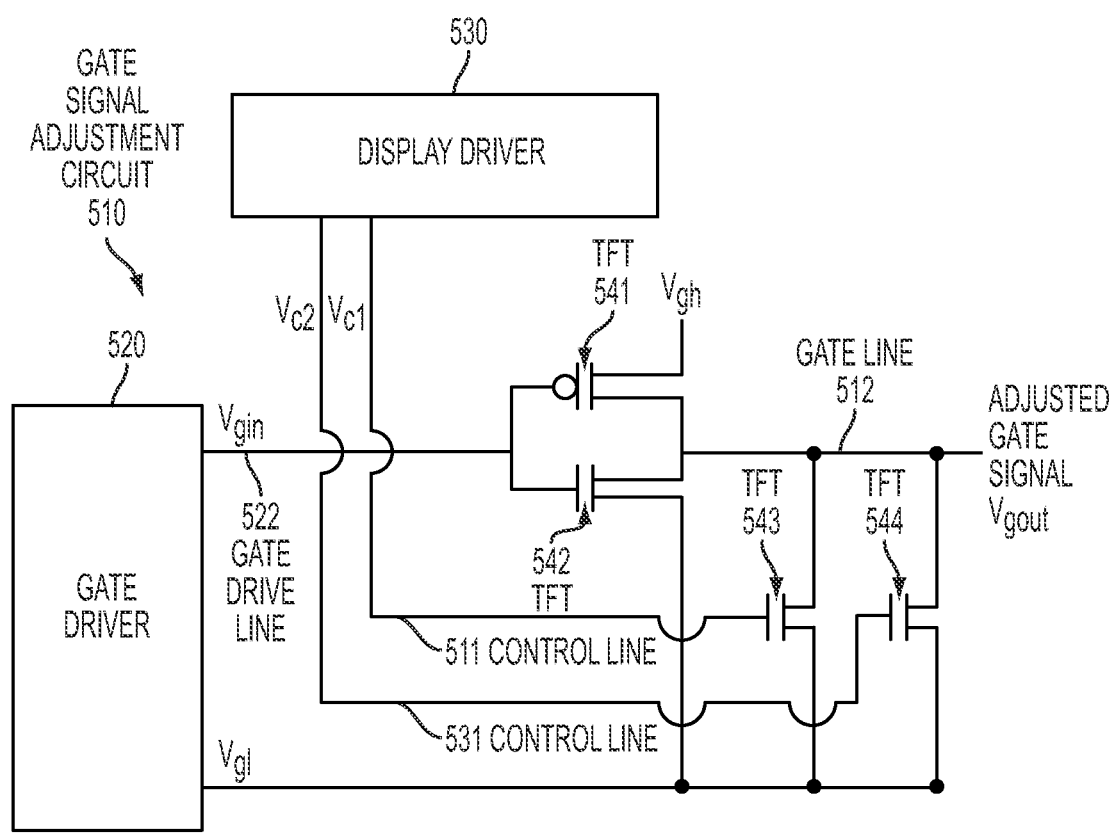
FIG. 5 illustrates another exemplary gate signal adjustment circuit according to various embodiments.

FIG. 5 illustrates another exemplary gate signal adjustment circuit according to various embodiments. In the example of FIG. 5, gate signal adjustment circuit 510 can include multiple thin film transistors (TFTs) 541, 542, 543, 544 for receiving a gate drive signal from gate driver 520, generating a gate signal, adjusting the gate signal, and outputting the adjusted gate signal. The circuit 510 can also include control lines 511, 531 for receiving control signals from display driver 530 to control the gate signal adjustment, input gate line 522 for receiving a gate drive signal from the gate driver 520, and output gate line 512 for sending an adjusted gate signal to the display area (not shown).

TFT 541 can be a p-type transistor with a gate terminal coupled to the input gate line 522 to receive and invert a gate drive signal from the gate driver 520, a source terminal coupled to a high voltage source Vgh from the gate driver, and a drain terminal coupled to the output gate line 512 to output either an unadjusted or an adjusted gate signal.

TFT 542 can be an n-type transistor with a gate terminal coupled to the input gate line 522 to receive a gate drive signal from the gate driver 520, a source terminal coupled to a low voltage source Vgl from the gate driver, and a drain terminal coupled to the output gate line 512 to output either an adjusted or unadjusted gate signal.

TFT 543 can be an n-type transistor with a gate terminal coupled to the control line 511 to receive a control signal from the display driver 530, a source terminal coupled to the low voltage source Vgl from the gate driver 520, and a drain terminal coupled to the output gate line 512 to output an adjustment signal for adjusting the outputted gate signal.

TFT 544 can be an n-type transistor in parallel with TFT 543 and can have a gate terminal coupled to the control line 531 to receive a control signal from the display driver 530, a source terminal coupled to the low voltage source Vgl from the gate driver 520, and a drain terminal coupled to the output gate line 512 to output an adjustment signal for adjusting the outputted gate signal.

The TFTs can be single-gate or multi-gate structures. Although the TFTs are described in particular p-type and n-type configurations, it is to be understood that other TFT type configurations are also possible according to the requirements of the display.

In some embodiments, TFTs 543, 544 can be different sizes to provide different adjustment signals for adjusting the gate signal. In some embodiments, TFTs 543, 544 can be the same size to provide similar adjustment signals for adjusting the gate signal.

In some embodiments, control signals from control lines 511, 531 can be digital signals, analog signals, or both.

Although two TFTs 543, 544 are shown in parallel here, it is to be understood that additional TFTs can be added in parallel to provide additional adjustment signal options according to the requirements of the display. For example, a third TFT can be added adjacent to TFT 544 to provide an adjustment signal and a third control line can be added adjacent to control line 531 to control the third parallel TFT. Similar additions can be made for a fourth parallel TFT and control line, a fifth parallel TFT and control line, and so on.

During operation, the gate signal adjustment circuit can have various operating conditions. The operating conditions of the control lines for the circuit of FIG. 5 can be the same as shown in Table 2. For example, gate drive signal Vgin from the gate driver 520 can be either high or low and the control signals Vc1, Vc2 from the display driver 530 can be either high or low, if digital, or a range of low-to-high voltages, if analog. In a high state, the signal Vgin can actuate TFT 542. Similarly, in a high state, the signal Vc1 can actuate TFT 543 and, in a high state, the signal Vc2 can actuate TFT 544. As a result, when both TFTs 543, 544 are actuated, they can transmit low voltage Vg1 in parallel to the output gate line 512 to interact with the low voltage Vg1 transmitted by actuated TFT 542, thereby forming the adjusted gate signal Vgout. Alternatively, when either TFT 543 or 544 is actuated, it can transmit low voltage Vg1 to the output gate line 512 to interact with the low voltage Vg1 transmitted by actuated TFT 542. The adjustments can be different depending on whether one or both of TFT 543, 544 are actuated. In this example, the falling time of the gate signal can be adjusted.

Figure 6:
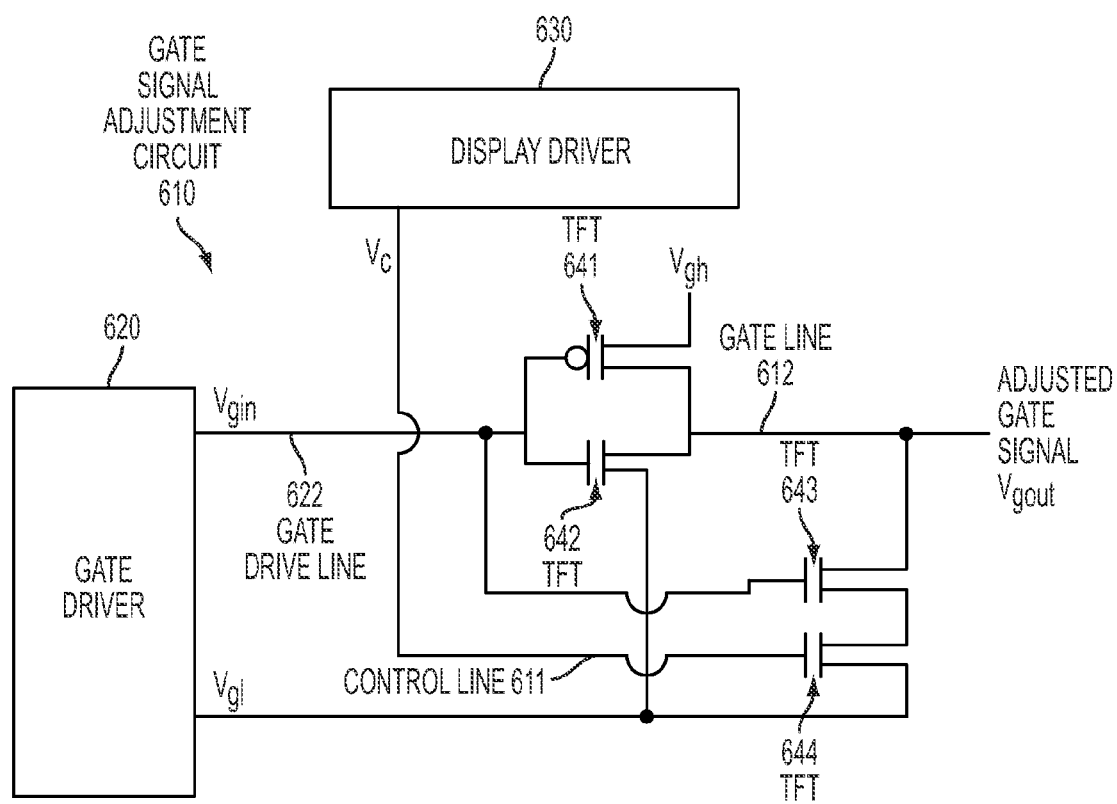
FIG. 6 illustrates another exemplary gate signal adjustment circuit according to various embodiments.

FIG. 6 illustrates another exemplary gate signal adjustment circuit according to various embodiments. In the example of FIG. 6, gate signal adjustment circuit 610 can include multiple thin film transistors (TFTs) 641, 642, 643, 644 for receiving a gate drive signal from gate driver 620, generating a gate signal, adjusting the gate signal, and outputting the adjusted gate signal. The circuit 610 can also include control lines 611 for receiving control signals from display driver 630 to control the gate signal adjustment, input gate line 622 for receiving a gate drive signal from the gate driver 620, and output gate line 612 for sending an adjusted gate signal to the display area (not shown).

TFT 641 can be a p-type transistor with a gate terminal coupled to the input gate line 622 to receive and invert a gate drive signal from the gate driver 620, a source terminal coupled to a high voltage source Vgh from the gate driver, and a drain terminal coupled to the output gate line 612 to output either an unadjusted or an adjusted gate signal.

TFT 642 can be an n-type transistor with a gate terminal coupled to the input gate line 622 to receive a gate drive signal from the gate driver 620, a source terminal coupled to a low voltage source Vg1 from the gate driver, and a drain terminal coupled to the output gate line 612 to output an adjusted or unadjusted gate signal.

TFT 643 can be an n-type transistor with a gate terminal coupled to the input gate line 622 to receive a gate drive signal from the gate driver 620, a source terminal coupled to a drain terminal of TFT 644 to receive an adjustment signal, and a drain terminal coupled to the output gate line 612 to output an adjustment signal for adjusting the outputted gate signal.

TFT 644 can be an n-type transistor in series with TFT 643 and can have a gate terminal coupled to the control line 611 to receive a control signal from the display driver 630, a source terminal coupled to the low voltage source Vg1 from the gate driver 620, and a drain terminal coupled to the source terminal of TFT 643 to output an adjustment signal to TFT 643 for adjusting the outputted gate signal.

The TFTs can be single-gate or multi-gate structures. Although the TFTs are described in particular p-type and n-type configurations, it is to be understood that other TFT type configurations are also possible according to the requirements of the display.

In some embodiments, control signals from the control line 611 can be digital signals, analog signals, or both. Analog control signals can cause TFT 644 to operate like a variable resistor.

Although two TFTs 643, 644 are shown in series here, it is to be understood that additional serial TFT pairs can be added in parallel with the shown pair to provide additional adjustment signal options according to the requirements of the display. For example, a third TFT can be added to output to the output gate line 612 and a fourth TFT can be added in series with the third TFT and coupled to the control line 611 or an added control line to provide an adjustment signal to the third TFT.

During operation, the gate signal adjustment circuit can have various operating conditions. The operating conditions of the control line for the circuit of FIG. 6 can be the same as shown in Table 1. For example, gate drive signal Vgin from the gate driver 620 can be either high or low and the control signal Vc from the display driver 630 can be either high or low, if digital, or a range of low-to-high voltages, if analog. In a high state, the signal Vgin can actuate TFT 642 and TFT 643. Similarly, in a high state, the signal Vc can actuate TFT 644. As a result, TFT 642 can output low voltage Vg1 as a gate signal, TFT 644 can output signal Vg1 to TFT 643, which can then output the signal Vg1 onto the output gate line 612 to interact with the signal Vg1 transmitted by actuated TFT 642, thereby forming the adjusted gate signal Vgout. In this example, the falling time of the gate signal can be adjusted.

Figure 7:
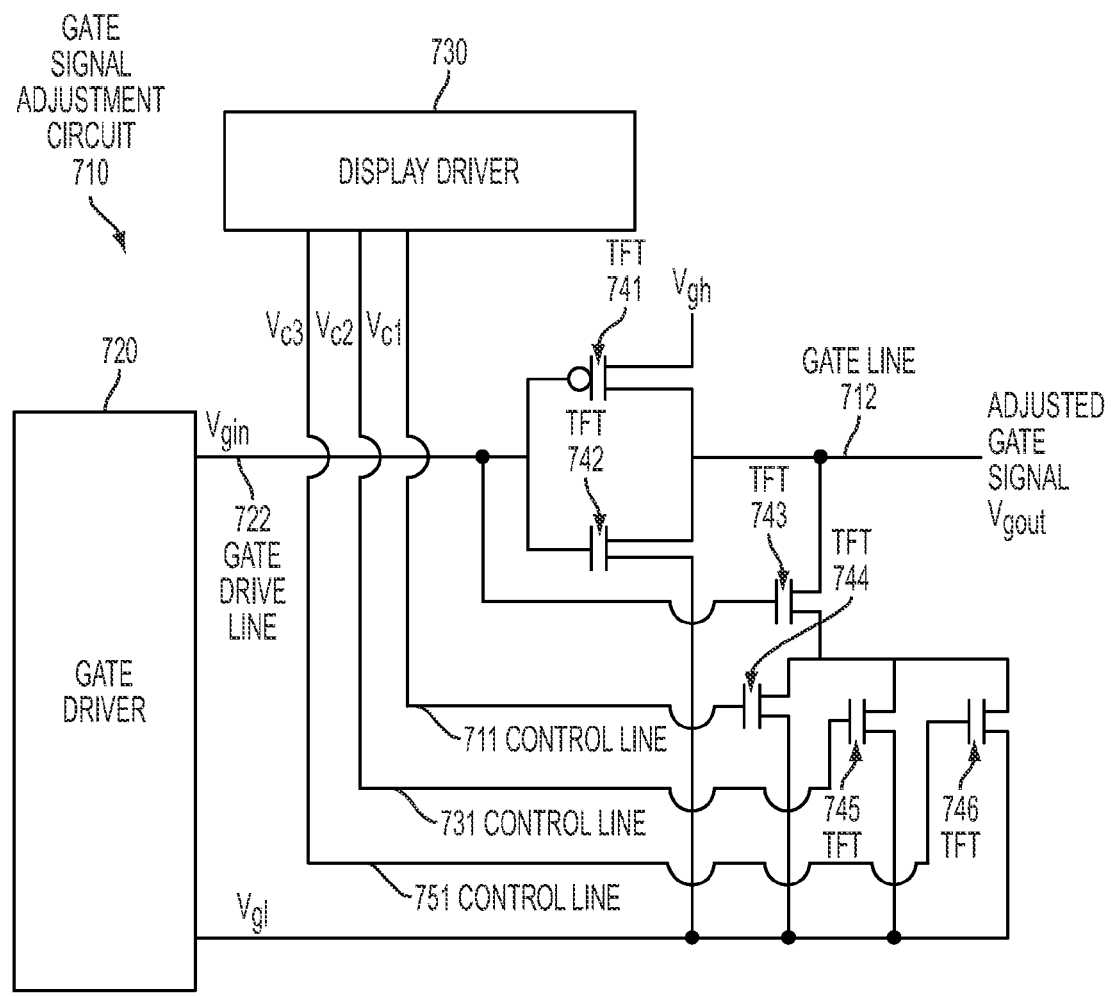
FIG. 7 illustrates another exemplary gate signal adjustment circuit according to various embodiments.

FIG. 7 illustrates another exemplary gate signal adjustment circuit according to various embodiments. In the example of FIG. 7, gate signal adjustment circuit 710 can include multiple thin film transistors (TFTs) 741, 742, 743, 744, 745, 746 for receiving a gate drive signal from gate driver 720, generating a gate signal, adjusting the gate signal, and outputting the adjusted gate signal. The circuit 710 can also include control lines 711, 731, 751 for receiving control signals from display driver 730 to control the gate signal adjustment, input gate line 722 for receiving a gate drive signal from the gate driver 720, and output gate line 712 for sending an adjusted gate signal to the display area (not shown).

TFT 741 can be a p-type transistor with a gate terminal coupled to the input gate line 722 to receive and invert a gate drive signal from the gate driver 720, a source terminal coupled to a high voltage source Vgh from the gate driver, and a drain terminal coupled to the output gate line 712 to output either an unadjusted or an adjusted gate signal.

TFT 742 can be an n-type transistor with a gate terminal coupled to the input gate line 722 to receive a gate drive signal from the gate driver 720, a source terminal coupled to a low voltage source Vg1 from the gate driver, and a drain terminal coupled to the output gate line 712 to output an adjusted or unadjusted gate signal.

TFT 743 can be an n-type transistor with a gate terminal coupled to the input gate line 722 to receive a gate drive signal from the gate driver 720, a source terminal coupled to the drain terminals of TFTs 744, 745, 746 to receive one or more adjustment signals, and a drain terminal coupled to the output gate line 712 to output an adjustment signal for adjusting the outputted gate signal.

TFT 744 can be an n-type transistor with a gate terminal coupled to the control line 511 to receive a control signal from the display driver 730, a source terminal coupled to the low voltage source Vg1 from the gate driver 720, and a drain terminal coupled to the source terminal of TFT 743 to output an adjustment signal for adjusting the gate signal.

TFT 745 can be an n-type transistor in parallel with TFT 744 and can have a gate terminal coupled to the control line 531 to receive a control signal from the display driver 730, a source terminal coupled to the low voltage source Vg1 from the gate driver 720, and a drain terminal coupled to the source terminal of TFT 743 to output an adjustment signal for adjusting the gate signal.

Similarly, TFT 746 can be an n-type transistor in parallel with TFTs 744, 745 and can have a gate terminal coupled to the control line 551 to receive a control signal from the display driver 730, a source terminal coupled to the low voltage source Vg1 from the gate driver 720, and a drain terminal coupled to the source terminal of TFT 743 to output an adjustment signal for adjusting the gate signal.

The TFTs can be single-gate or multi-gate structures. Although the TFTs are described in particular p-type and n-type configurations, it is to be understood that other TFT type configurations are also possible according to the requirements of the display.

In some embodiments, TFTs 744, 745, 746 can be different sizes to provide different adjustment signals for adjusting the gate signal. In some embodiments, TFTs 744, 745, 746 can be the same size to provide similar adjustment signals for adjusting the gate signal.

In some embodiments, control signals from control lines 711, 731, 751 can be digital signals, analog signals, or both. In some embodiments, each parallel TFT 744, 745, 746 can have a separate control line 711, 731, 751 respectively, as shown here. In some embodiments, one or more parallel TFTs can share a control line.

Although three TFTs 744, 745, 746 are shown in parallel here, it is to be understood that additional TFTs can be added in parallel to provide additional adjustment signal options according to the requirements of the display. For example, a fourth TFT can be added adjacent to TFT 746 to provide an adjustment signal and a fourth control line can be added adjacent to control line 751 to control the fourth parallel TFT. Similar additions can be made for a fifth parallel TFT and control line, a sixth parallel TFT and control line, and so on.

During operation, the gate signal adjustment circuit can have various operating conditions. Table 3 shows various operating conditions of the control line signals Vc1, Vc2, Vc3, which can affect adjustment of the gate signal.

TABLE 3

Operating conditions for gate signal adjustment circuit control lines of FIG. 7.

| Vc1 | Vc2 | Vc3 |
|---|---|---|
| high | high | high |
| low | high | high |
| high | low | high |
| low | low | high |
| high | high | low |
| low | high | low |
| high | low | low |
| low | low | low |

For example, gate drive signal Vgin from the gate driver 720 can be either high or low and the control signals Vc1, Vc2, Vc3 from the display driver 730 can be either high or low, if digital, or a range of low-to-high voltages, if analog. In a high state, the signal Vgin can actuate TFT 742 and TFT 743. Similarly, in a high state, the signal Vc1 can actuate TFT 744; in a high state, the signal Vc2 can actuate TFT 745; and in a high state, the signal Vc3 can actuate TFT 746. As a result, when one, two, or all three of TFTs 744, 745, 746 are actuated, they can transmit low voltage Vg1 in parallel to TFT 743, which can then output the signal Vg1 onto the output gate line 712 to interact with a low voltage signal Vg1 transmitted by the actuated TFT 742 onto the output gate line, thereby forming the adjusted gate signal Vgout. The adjustments can be different depending on how many of TFT 744, 745, 746 are actuated. In this example, the falling time of the gate signal can be adjusted.

Figure 8:
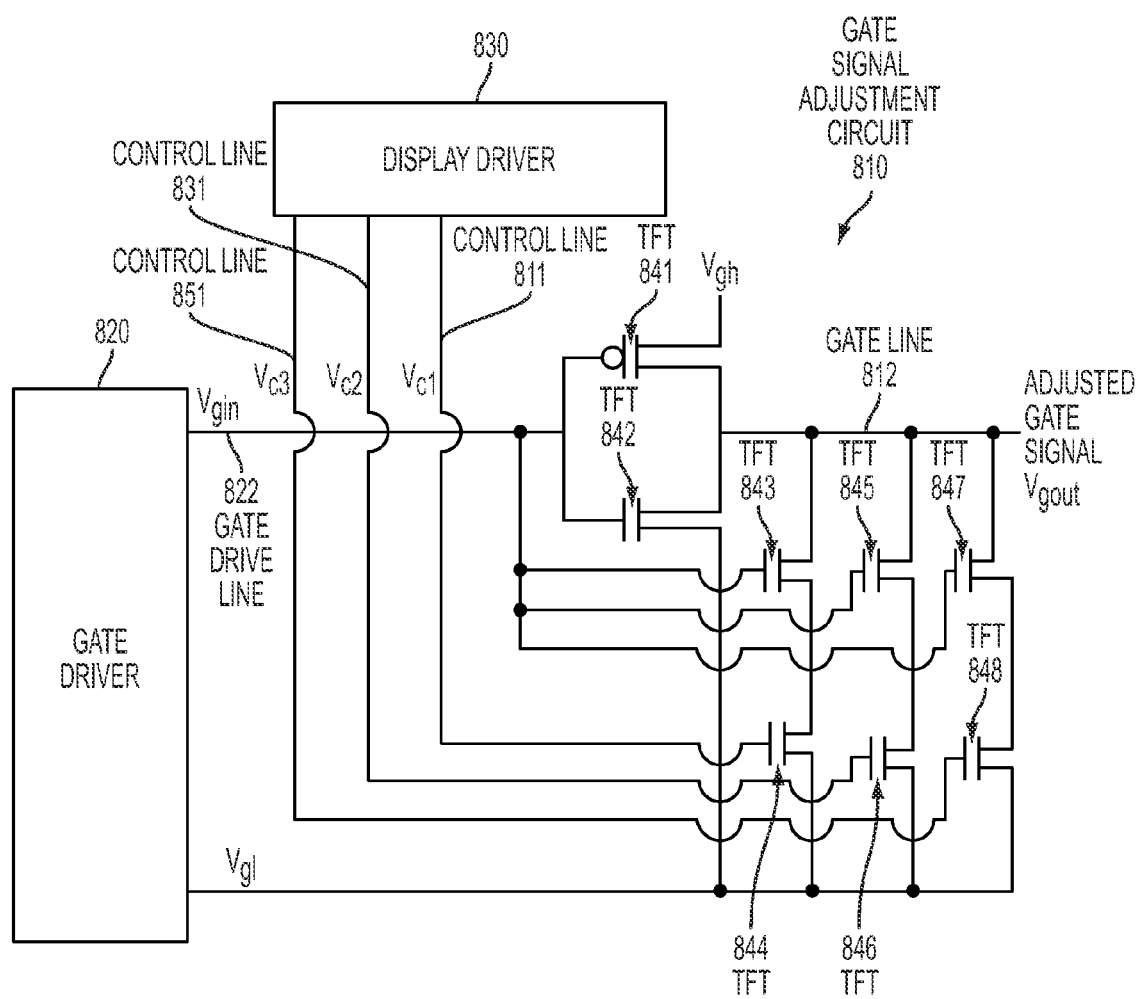
FIG. 8 illustrates another exemplary gate signal adjustment circuit according to various embodiments.

FIG. 8 illustrates another exemplary gate signal adjustment circuit according to various embodiments. In the example of FIG. 8, gate signal adjustment circuit 610 can include multiple thin film transistors (TFTs) 841, 842, 843, 844, 845, 846, 847, 848 for receiving a gate drive signal from gate driver 820, generating a gate signal, adjusting the gate signal, and outputting the adjusted gate signal. The circuit 810 can also include control lines 811, 831, 851 for receiving control signals from display driver 830 to control the gate signal adjustment, input gate line 822 for receiving a gate drive signal from the gate driver 820, and output gate line 812 for sending an adjusted gate signal to the display area (not shown).

TFT 841 can be a p-type transistor with a gate terminal coupled to the input gate line 822 to receive and invert a gate drive signal from the gate driver 820, a source terminal coupled to a high voltage source Vgh from the gate driver, and a drain terminal coupled to the output gate line 812 to output either an unadjusted or an adjusted gate signal.

TFT 842 can be an n-type transistor with a gate terminal coupled to the input gate line 822 to receive a gate drive signal from the gate driver 820, a source terminal coupled to a low voltage source Vg1 from the gate driver, and a drain terminal coupled to the output gate line 812 to output an adjusted or unadjusted gate signal.

TFT 843 can be an n-type transistor with a gate terminal coupled to the input gate line 822 to receive a gate drive signal from the gate driver 820, a source terminal coupled to a drain terminal of TFT 844 to receive an adjustment signal, and a drain terminal coupled to the output gate line 812 to output an adjustment signal for adjusting the outputted gate signal.

TFT 844 can be an n-type transistor in series with TFT 843 and can have a gate terminal coupled to the control line 811 to receive a control signal from the display driver 830, a source terminal coupled to the low voltage source Vg1 from the gate driver 820, and a drain terminal coupled to the source terminal of TFT 843 to output an adjustment signal to TFT 843 for adjusting the gate signal.

TFT 845 can be an n-type transistor with a gate terminal coupled to the input gate line 822 to receive a gate drive signal from the gate driver 820, a source terminal coupled to a drain terminal of TFT 846 to receive an adjustment signal, and a drain terminal coupled to the output gate line 812 to output an adjustment signal for adjusting the outputted gate signal.

TFT 846 can be an n-type transistor in series with TFT 845 and can have a gate terminal coupled to the control line 831 to receive a control signal from the display driver 830, a source terminal coupled to the low voltage source Vg1 from the gate driver 820, and a drain terminal coupled to the source terminal of TFT 845 to output an adjustment signal to TFT 845 for adjusting the gate signal.

TFT pair 845, 846 can be in parallel with TFT pair 843, 844.

TFT 847 can be an n-type transistor with a gate terminal coupled to the input gate line 822 to receive a gate drive signal from the gate driver 820, a source terminal coupled to a drain terminal of TFT 848 to receive an adjustment signal, and a drain terminal coupled to the output gate line 812 to output an adjustment signal for adjusting the outputted gate signal.

TFT 848 can be an n-type transistor in series with TFT 847 and can have a gate terminal coupled to the control line 851 to receive a control signal from the display driver 830, a source terminal coupled to the low voltage source Vg1 from the gate driver 820, and a drain terminal coupled to the source terminal of TFT 847 to output an adjustment signal to TFT 847 for adjusting the gate signal.

TFT pair 847, 848 can be in parallel with TFT pairs 843, 844 and 845, 846.

The TFTs can be single-gate or multi-gate structures. Although the TFTs are described in particular p-type and n-type configurations, it is to be understood that other TFT type configurations are also possible according to the requirements of the display.

In some embodiments, control signals from the control lines 811, 831, 851 can be digital signals, analog signals, or both.

In some embodiments, TFTs 843, 844, 845, 846, 847, 848 can be different sizes to provide different adjustment signals for adjusting the gate signal. In some embodiments, they can be the same size to provide similar adjustment signals for adjusting the gate signal.

Although three TFT parallel pairs 843, 844 and 845, 846 and 847, 848 are shown here, it is to be understood that additional parallel TFT pairs can be added to provide additional adjustment signal options according to the requirements of the display. For example, a fourth TFT pair can be added to output to the output gate line 812 and a fourth control line can be added adjacent the control line 851 to input to the fourth TFT pair. Similar additions can be made for a fifth pair and control line, a sixth pair and control line, and so on.

During operation, the gate signal adjustment circuit can have various operating conditions. The operating conditions of the control line for the circuit of FIG. 8 can be the same as shown in Table 3. For example, gate drive signal Vgin from the gate driver 820 can be either high or low and the control signals Vc1, Vc2, Vc3 from the display driver 830 can be either high or low, if digital, or a range of low-to-high voltages, if analog. In a high state, the signal Vgin can actuate TFTs 842, 843, 845, 847. Similarly, in a high state, the signal Vc1 can actuate TFT 844; in a high state, the signal Vc2 can actuate TFT 846; and in a high state, the signal Vc3 can actuate TFT 848. As a result, when TFT 844 is actuated, it can transmit low voltage Vg1 to TFT 843, which can then output the signal Vg1 onto the output gate line 812 to interact with a low voltage signal Vg1 transmitted by the actuated TFT 842 onto the output gate line, thereby forming the adjusted gate signal Vgout. Similarly, when TFT 846 is actuated, it can transmit low voltage signal Vg1 to TFT 845, which can then output the signal Vg1 onto the output gate line 812 to interact with the signal Vg1 from the actuated TFT 842, thereby forming the adjusted gate signal Vgout. Similarly, when TFT 848 is actuated, it can transmit low voltage signal Vg1 to TFT 847, which can then output the signal Vg1 onto the output gate line 812 to interact with the signal Vg1 from the actuated TFT 842, thereby forming the adjusted gate signal Vgout. The adjustments can be different depending on how many of TFT 844, 846, 848 are actuated. In this example, the falling time of the gate signal can be adjusted.

Figure 9:
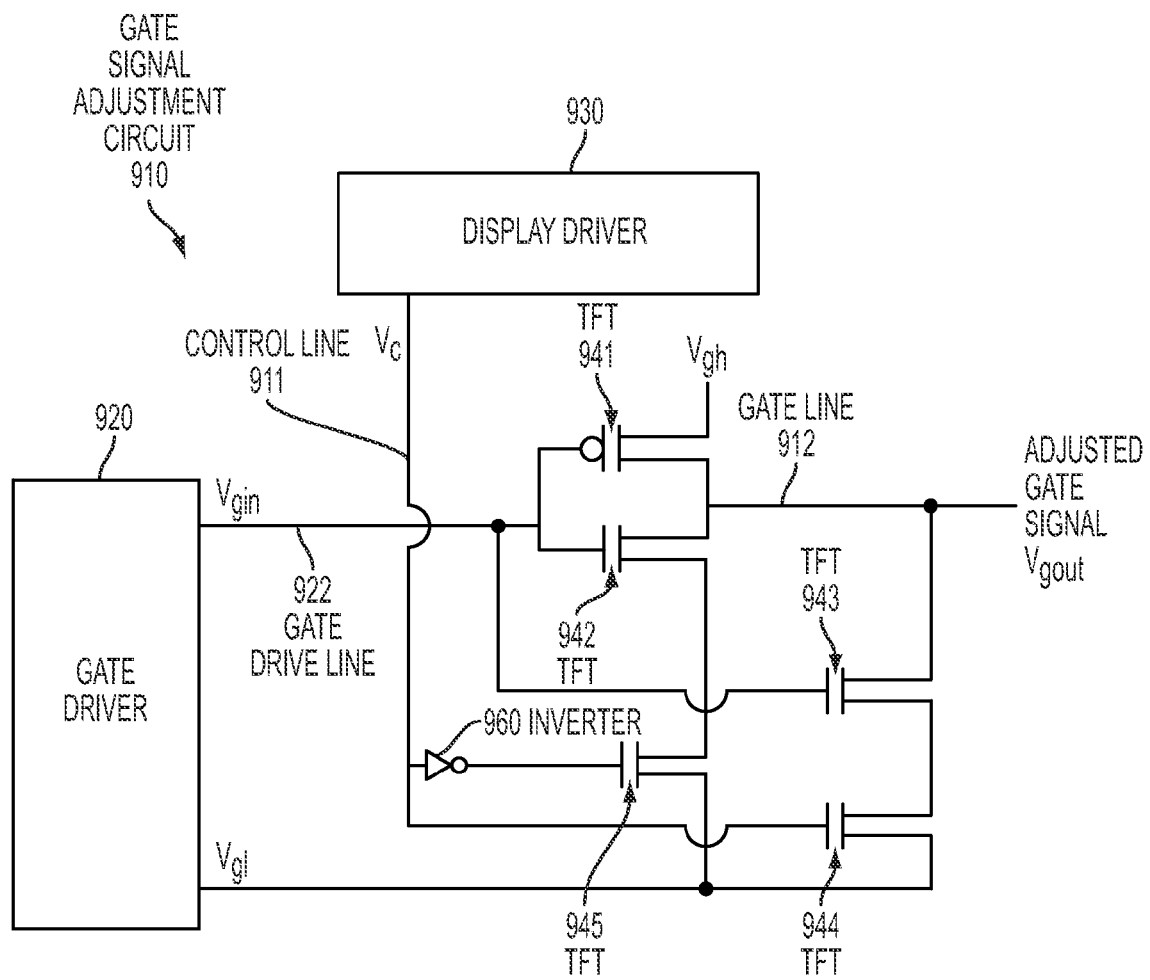
FIG. 9 illustrates another exemplary gate signal adjustment circuit according to various embodiments.

FIG. 9 illustrates another exemplary gate signal adjustment circuit according to various embodiments. In the example of FIG. 9, gate signal adjustment circuit 910 can include multiple thin film transistors (TFTs) 941, 942, 943, 944, 945 for receiving a gate drive signal from gate driver 920, generating a gate signal, adjusting the gate signal, and outputting the adjusted gate signal. The circuit 910 can also include control line 911 for receiving a control signal from display driver 930 to control the gate signal adjustment, input gate line 922 for receiving a gate drive signal from the gate driver 920, and output gate line 912 for sending an adjusted gate signal to the display area (not shown).

TFT 941 can be a p-type transistor with a gate terminal coupled to the input gate line 922 to receive and invert a gate drive signal from the gate driver 920, a source terminal coupled to a high voltage source Vgh from the gate driver, and a drain terminal coupled to the output gate line 912 to output either an unadjusted or an adjusted gate signal.

TFT 942 can be an n-type transistor with a gate terminal coupled to the input gate line 922 to receive a gate drive signal from the gate driver 920, a source terminal coupled to a drain terminal of TFT 945 to receive an adjustment signal, and a drain terminal coupled to the output gate line 912 to output an adjusted gate signal based on the received adjustment signal or to output an unadjusted gate signal.

TFT 943 can be an n-type transistor with a gate terminal coupled to the input gate line 922 to receive a gate drive signal from the gate driver 920, a source terminal coupled to the drain terminal of TFT 944 to receive an adjustment signal for adjusting the outputted gate signal, and a drain terminal coupled to the output gate line 912 to output an adjustment signal for adjusting the outputted gate signal.

TFT 944 can be an n-type transistor in series with TFT 943 and can have a gate terminal coupled to the control line 911 to receive a control signal from the display driver 930, a source terminal coupled to a low voltage source Vg1 from the gate driver 920, and a drain terminal coupled to the source terminal of TFT 943 to output an adjustment signal to TFT 943 for adjusting the outputted gate signal.

TFT 945 can be an n-type transistor with a gate terminal coupled to inverter 960, which inverts the control signal from the control line 911, to receive an inverted control signal from the display driver 930, a source terminal coupled to a low voltage source Vg1 from the gate driver 920, and a drain terminal coupled to the source terminal of TFT 942 to output the adjustment signal to TFT 942 for adjusting the gate signal.

The TFTs can be single-gate or multi-gate structures. Although the TFTs are described in particular p-type and n-type configurations, it is to be understood that other TFT type configurations are also possible according to the requirements of the display.

In some embodiments, the control signals can be digital, analog, or both.

In some embodiments, TFTs 943, 944, 945 can be different sizes to provide different adjustment signals for adjusting the gate signal. In some embodiments, they can be the same size to provide similar adjustment signals for adjusting the gate signal.

In some embodiments, the inverter 960 can be replaced with a second control line that provides an inverse of the control signal provided by the control line 911. In which case, the second control line would be coupled to TFT 945.

Although two TFTs 943, 944 are shown in series here, it is to be understood that additional serial TFT pairs can be added in parallel with the shown pair to provide additional adjustment signal options according to the requirements of the display. For example, a third TFT can be added to output to the output gate line 912 and a fourth TFT can be added in series with the third TFT and coupled to the control line 911 or an added control line to provide an adjustment signal to the third TFT.

During operation, the gate signal adjustment circuit can have various operating conditions. The operating conditions of the control line for the circuit of FIG. 9 can be the same as shown in Table 1. For example, gate drive signal Vgin from the gate driver 920 can be either high or low and the control signal Vc from the display driver 930 can be either high or low, if digital, or a range of low-to-high voltages, if analog. In a high state, the signal Vgin can actuate TFT 942 and TFT 943. Similarly, in a high state, the signal Vc can actuate TFT 944 and not actuate TFT 945. As a result, TFT 944 can output signal Vg1 to TFT 943, which can then output the signal Vg1 onto the output gate line 912 as the adjusted gate signal Vgout. When the signal Vc is low, TFT 945 can actuate and TFT 944 not actuate. As a result, TFT 945 can output signal Vg1 to TFT 942, which can then output the signal Vg1 onto the output gate line 912 as the adjusted gate signal Vgout. The adjustments can be different depending on whether TFT 944 or TFT 945 is actuated. In this example, the falling time of the gate signal can be adjusted.

Figure 10:
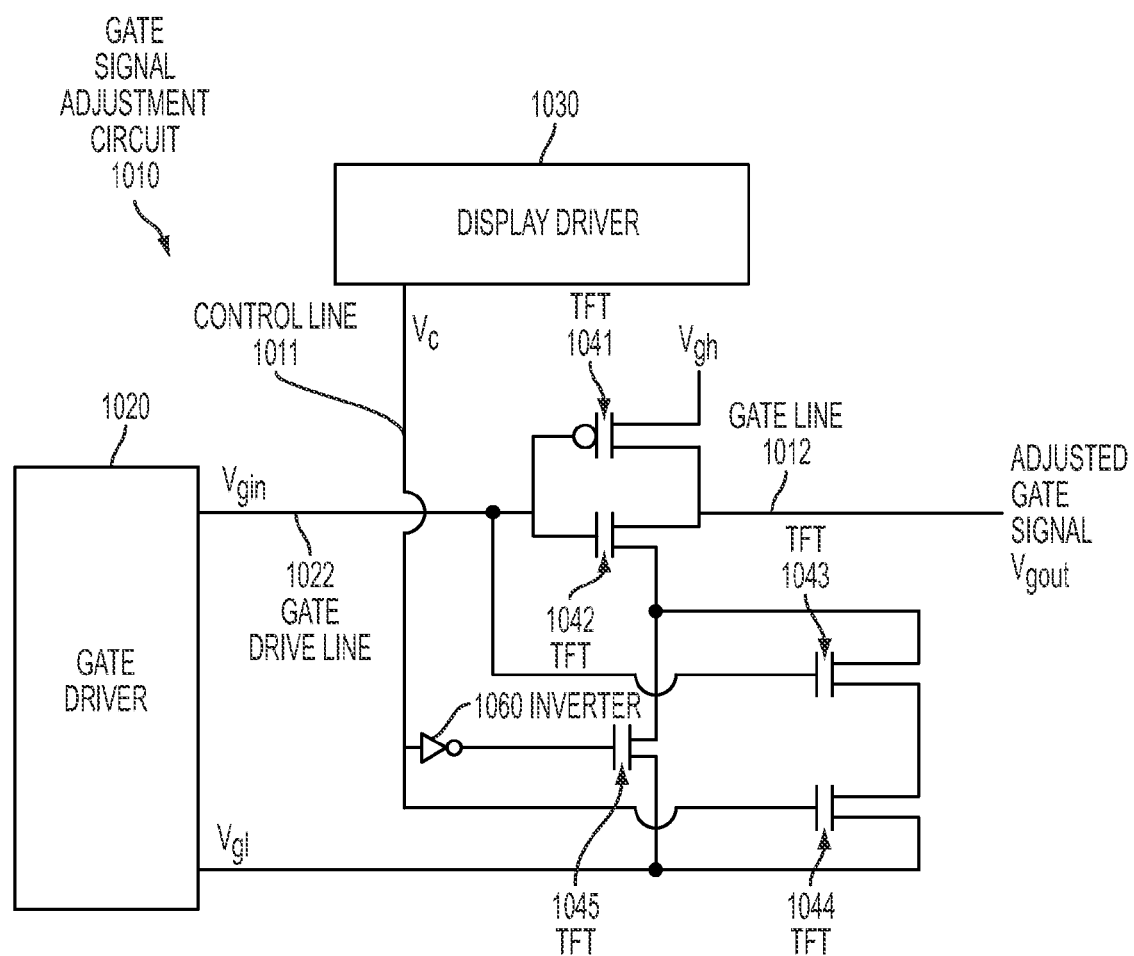
FIG. 10 illustrates another exemplary gate signal adjustment circuit according to various embodiments.

FIG. 10 illustrates another exemplary gate signal adjustment circuit according to various embodiments. In the example of FIG. 10, gate signal adjustment circuit 1010 can include multiple thin film transistors (TFTs) 1041, 1042, 1043, 1044, 1045 for receiving a gate drive signal from gate driver 1020, generating a gate signal, adjusting the gate signal, and outputting the adjusted gate signal. The circuit 1010 can also include control line 1011 for receiving a control signal from display driver 1030 to control the gate signal adjustment, input gate line 1022 for receiving a gate drive signal from the gate driver 1020, and output gate line 1012 for sending an adjusted gate signal to the display area (not shown).

TFT 1041 can be a p-type transistor with a gate terminal coupled to the input gate line 1022 to receive and invert a gate drive signal from the gate driver 1020, a source terminal coupled to a high voltage source Vgh from the gate driver, and a drain terminal coupled to the output gate line 1012 to output either an unadjusted or an adjusted gate signal.

TFT 1042 can be an n-type transistor with a gate terminal coupled to the input gate line 1022 to receive a gate drive signal from the gate driver 1020, a source terminal coupled to the drain terminals of TFTs 1045, 1043 to receive one or more adjustment signals, and a drain terminal coupled to the output gate line 1012 to output an adjusted gate signal based on the received adjustment signal or to output an unadjusted gate signal.

TFT 1043 can be an n-type transistor with a gate terminal coupled to the input gate line 1022 to receive a gate drive signal from the gate driver 1020, a source terminal coupled to the drain terminal of TFT 1044 to receive an adjustment signal for adjusting the outputted gate signal, and a drain terminal coupled to the source terminal of TFT 1042 to output an adjustment signal for adjusting the gate signal.

TFT 1044 can be an n-type transistor in series with TFT 1043 and can have a gate terminal coupled to the control line 1011 to receive a control signal from the display driver 1030 a source terminal coupled to a low voltage source Vg1 from the gate driver 1020, and a drain terminal coupled to the source terminal of TFT 1043 to output an adjustment signal to TFT 1043 for adjusting the gate signal.

TFT 1045 can be an n-type transistor with a gate terminal coupled to inverter 1060, which inverts the control signal from the control line 1011, to receive an inverted control signal from the display driver 1030, a source terminal coupled to a low voltage source Vg1 from the gate driver 1020, and a drain terminal coupled to the source terminal of TFT 1042 to output an adjustment signal to TFT 1042 for adjusting the gate signal.

The TFTs can be single-gate or multi-gate structures. Although the TFTs are described in particular p-type and n-type configurations, it is to be understood that other TFT type configurations are also possible according to the requirements of the display.

In some embodiments, the control signals can be digital, analog, or both.

In some embodiments, TFTs 1043, 1044, 1045 can be different sizes to provide different adjustment signals for adjusting the gate signal. In some embodiments, they can be the same size to provide similar adjustment signals for adjusting the gate signal.

In some embodiments, the inverter 1060 can be replaced with a second control line that provides an inverse of the control signal provided by the control line 1011. In which case, the second control line would be coupled to TFT 1045.

Although two TFTs 1043, 1044 are shown in series here, it is to be understood that additional serial TFT pairs can be added in parallel with the shown pair to provide additional adjustment signal options according to the requirements of the display. For example, a third TFT can be added to output to the source terminal of TFT 1042 and a fourth TFT can be added in series with the third TFT and coupled to the control line 1011 or an added control line to provide an adjustment signal to the third TFT.

During operation, the gate signal adjustment circuit can have various operating conditions. The operating conditions of the control line for the circuit of FIG. 10 can be the same as shown in Table 1. For example, gate drive signal Vgin from the gate driver1020 can be either high or low and the control signal Vc from the display driver 1030 can be either high or low, if digital, or a range of low-to-high voltages, if analog. In a high state, the signal Vgin can actuate TFT 1042 and TFT 1043. Similarly, in a high state, the signal Vc can actuate TFT 1044 and not actuate TFT 1045. As a result, TFT 1044 can output signal Vg1 to TFT 1043, which can then output the signal Vg1 to TFT 1042 for transmitting on the output gate line 1012 as the adjusted gate signal Vgout. When the signal Vc is low, TFT 1045 can actuate and TFT 1044 not actuate. As a result, TFT 1045 can output signal Vg1 to TFT 1042, which can then output the signal Vg1 onto the output gate line 1012 as the adjusted gate signal Vgout. The adjustments can be different depending on whether TFT 1044 or TFT 1045 is actuated. In this example, the falling time of the gate signal can be adjusted.

Figure 11:
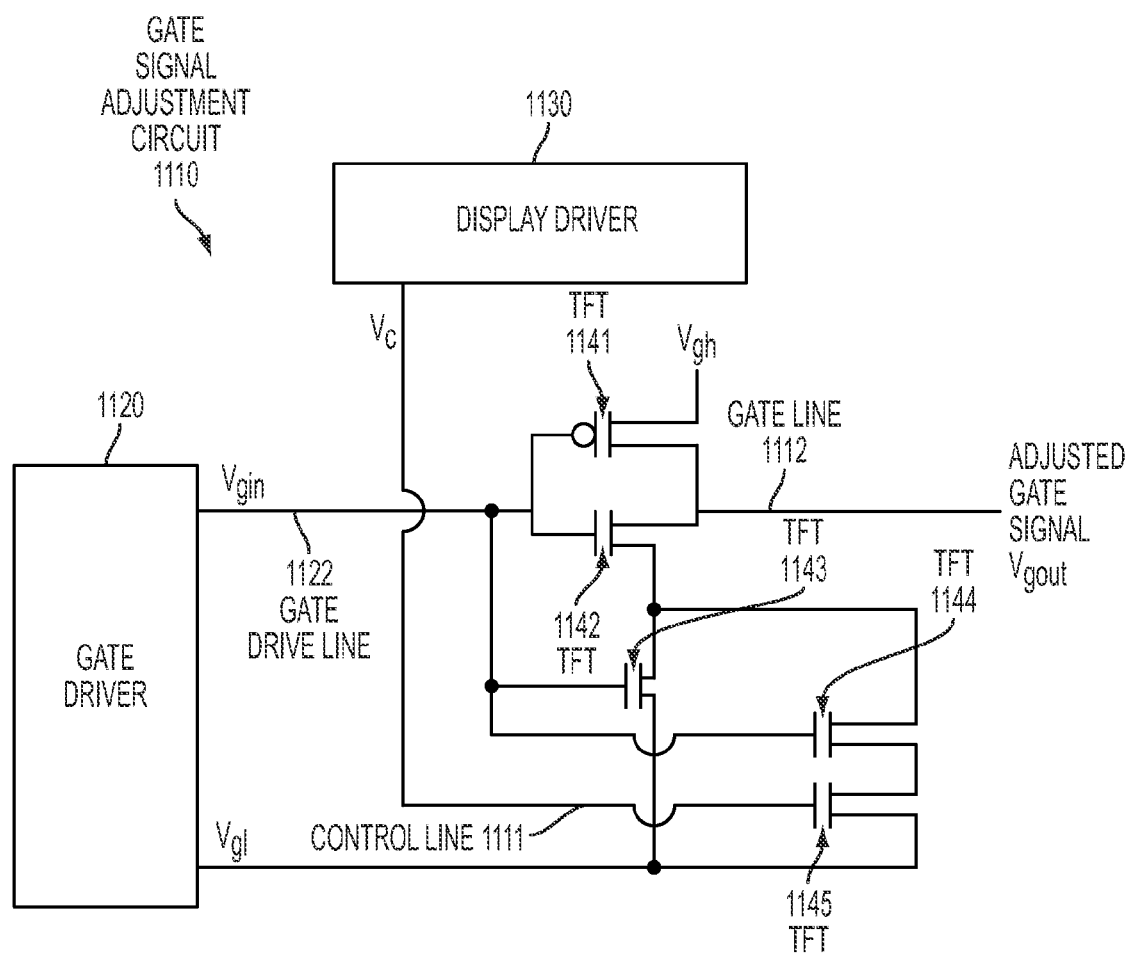
FIG. 11 illustrates another exemplary gate signal adjustment circuit according to various embodiments.

FIG. 11 illustrates an exemplary gate signal adjustment circuit according to various embodiments. In the example of FIG. 11, gate signal adjustment circuit 1110 can include multiple thin film transistors (TFTs) 1141, 1142, 1143, 1144, 1145 for receiving a gate drive signal from gate driver 1120, generating a gate signal, adjusting the gate signal, and outputting the adjusted gate signal. The circuit 1110 can also include control line 1111 for receiving a control signal from display driver 1130 to control the gate signal adjustment, input gate line 1122 for receiving a gate signal from the gate driver 1120, and output gate line 1112 for sending an adjusted gate signal to the display area (not shown).

TFT 1141 can be a p-type transistor with a gate terminal coupled to the input gate line 1122 to receive and invert a gate drive signal from the gate driver 1120, a source terminal coupled to a high voltage source Vgh from the gate driver, and a drain terminal coupled to the output gate line 1112 to output either an unadjusted or an adjusted gate signal.

TFT 1142 can be an n-type transistor with a gate terminal coupled to the input gate line 1122 to receive a gate drive signal from the gate driver 1120, a source terminal coupled to the drain terminals of TFTs 1143, 1144 to receive one or more adjustment signals, and a drain terminal coupled to the output gate line 1112 to output an adjusted gate signal based on the received adjustment signal or to output an unadjusted gate signal.

TFT 1143 can be an n-type transistor with a gate terminal coupled to the input gate line 1122 to receive a gate drive signal from the gate driver 1120, a source terminal coupled to a low voltage source Vgl from the gate driver 1120, and a drain terminal coupled to the source terminal of TFT 1142 to output an adjustment signal to TFT 1142 for adjusting the gate signal.

TFT 1144 can be an n-type transistor with a gate terminal coupled to the input gate line 1122 to receive a gate drive signal from the gate driver 1120, a source terminal coupled to the drain terminal of TFT 1145 to receive an adjustment signal for adjusting the gate signal, and a drain terminal coupled to the source terminal of TFT 1142 to output an adjustment signal for adjusting the gate signal.

TFT 1145 can be an n-type transistor in series with TFT 1144 and can have a gate terminal coupled to the control line 1111 to receive a control signal from the display driver 1130, a source terminal coupled to a low voltage source Vgl from the gate driver 1120, and a drain terminal coupled to the source terminal of TFT 1144 to output an adjustment signal to TFT 1144 for adjusting the gate signal.

The TFTs can be single-gate or multi-gate structures. Although the TFTs are described in particular p-type and n-type configurations, it is to be understood that other TFT type configurations are also possible according to the requirements of the display.

In some embodiments, the control signals can be digital, analog, or both.

In some embodiments, TFTs 1143, 1144, 1145 can be different sizes to provide different adjustment signals for adjusting the gate signal. In some embodiments, they can be the same size to provide similar adjustment signals for adjusting the gate signal.

Although two TFTs 1144, 1145 are shown in series here, it is to be understood that additional serial TFT pairs can be added in parallel with the shown pair to provide additional adjustment signal options according to the requirements of the display. For example, a third TFT can be added to output to the source terminal of TFT 1142 and a fourth TFT can be added in series with the third TFT and coupled to the control line 1111 or an added control line to provide an adjustment signal to the third TFT.

During operation, the gate signal adjustment circuit can have various operating conditions. The operating conditions of the control line for the circuit of FIG. 11 can be the same as shown in Table 1. For example, gate drive signal Vgin from the gate driver 1120 can be either high or low and the control signal Vc from the display driver 1130 can be either high or low, if digital, or a range of low-to-high voltages, if analog. In a high state, the signal Vgin can actuate TFTs 1142, 1143, 1144. Similarly, in a high state, the signal Vc can actuate TFT 1145. As a result, TFT 1143 can output low voltage signal Vgl to TFT 1142, which can transmit the signal Vgl onto the output gate line 1112 as the gate signal. TFT 1145 can output signal Vgl to TFT 1044, which can then output the signal Vgl to TFT 1142 to interact with the gate signal from TFT 1143, thereby forming the adjusted gate signal Vgout. When the control signal Vc is low, TFT 1145 can be off or low, such that the adjusted gate signal can come from TFT 1143 to TFT 1142. The adjustments can be different depending on whether TFT 1145 is actuated. In this example, the falling time of the gate signal can be adjusted.

Figure 12:
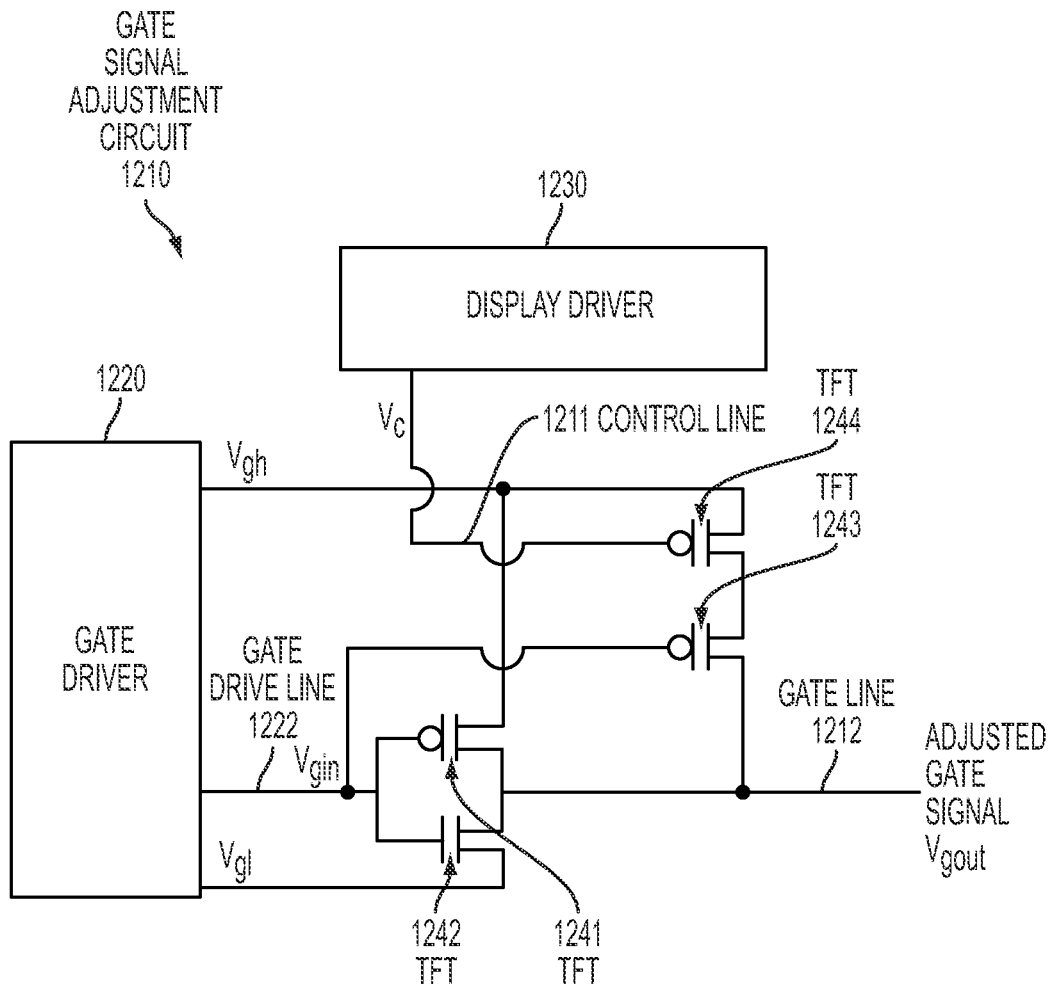
FIG. 12 illustrates another exemplary gate signal adjustment circuit according to various embodiments.

FIG. 12 illustrates another exemplary gate signal adjustment circuit according to various embodiments. The circuit of FIG. 12 is a mirror circuit of the circuit of FIG. 6. In the FIG. 12 circuit, the rising time of the gate signal can be adjusted, while in the FIG. 6 circuit, the falling time of the gate signal can be adjusted. In the example of FIG. 12, gate signal adjustment circuit 1210 can include multiple thin film transistors (TFTs) 1241, 1242, 1243, 1244 for receiving a gate drive signal from gate driver 1220, generating a gate signal, adjusting the gate signal, and outputting the adjusted gate signal. The circuit 1210 can also include control lines 1211 for receiving control signals from display driver 1230 to control the gate signal adjustment, input gate line 1222 for receiving a gate drive signal from the gate driver 1220, and output gate line 1212 for sending an adjusted gate signal to the display area (not shown).

TFT 1241 can be a p-type transistor with a gate terminal coupled to the input gate line 1222 to receive and invert a gate drive signal from the gate driver 1220, a source terminal coupled to a high voltage source Vgh from the gate driver, and a drain terminal coupled to the output gate line 1212 to output either an unadjusted or an adjusted gate signal.

TFT 1242 can be an n-type transistor with a gate terminal coupled to the input gate line 1222 to receive a gate drive signal from the gate driver 1220, a source terminal coupled to a low voltage source Vgl from the gate driver, and a drain terminal coupled to the output gate line 1212 to output a gate signal.

TFT 1243 can be a p-type transistor with a gate terminal coupled to the input gate line 1222 to receive and invert a gate drive signal from the gate driver 1220, a source terminal coupled to a drain terminal of TFT 1244 to receive an adjustment signal, and a drain terminal coupled to the output gate line 1212 to output an adjustment signal for adjusting the outputted gate signal.

TFT 1244 can be a p-type transistor in series with TFT 1243 and can have a gate terminal coupled to the control line 1211 to receive a control signal from the display driver 1230, a source terminal coupled to the high voltage source Vgh from the gate driver 1220, and a drain terminal coupled to the source terminal of TFT 1243 to output an adjustment signal to TFT 1243 for adjusting the outputted gate signal.

The TFTs can be single-gate or multi-gate structures. Although the TFTs are described in particular p-type and n-type configurations, it is to be understood that other TFT type configurations are also possible according to the requirements of the display.

In some embodiments, control signals from the control line 1211 can be digital signals. In some embodiments, the control signals can be analog, causing TFT 1244 to operate like a variable resistor.

Although two TFTs 1243, 1244 are shown in series here, it is to be understood that additional serial TFT pairs can be added in parallel with the shown pair to provide additional adjustment signal options according to the requirements of the display. For example, a third TFT can be added to output to the output gate line 1212 and a fourth TFT can be added in series with the third TFT and coupled to the control line 1211 or an added control line to provide an adjustment signal to the third TFT.

During operation, the gate signal adjustment circuit can have various operating conditions. The operating conditions of the control line for the circuit of FIG. 12 can be the same as shown in Table 1. For example, gate drive signal Vgin from the gate driver 620 can be either high or low and the control signal Vc from the display driver 1230 can be either high or low, if digital, or a range of low-to-high voltages, if analog. In a low state, the signal Vgin can actuate TFT 1241 and TFT 1243. Similarly, in a low state, the signal Vc can actuate TFT 1244. As a result, TFT 1241 can output high voltage Vgh as a gate signal, TFT 1244 can output signal Vgh to TFT 1243, which can then output the signal Vgh onto the output gate line 1212 to interact with the signal Vgh transmitted by actuated TFT 1241, thereby forming the adjusted gate signal Vgout. In this example, the rising time of the gate signal can be adjusted.

Similar minor circuits of the other circuits, e.g., FIGS. 3-5 and 7-11, can also be implements to adjust the rising time, rather than the falling time, of the gate signal.

Figure 13:
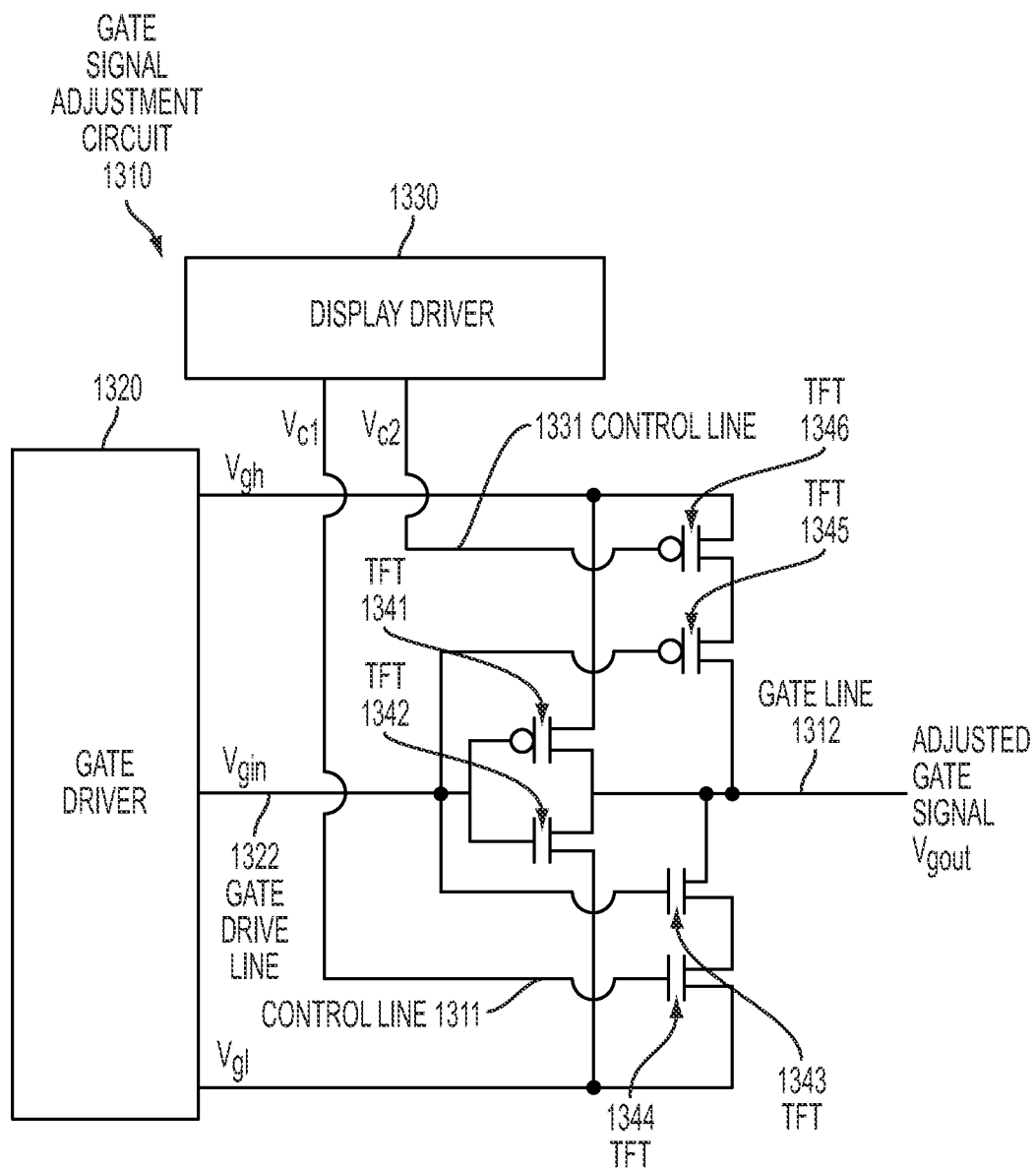
FIG. 13 illustrates another exemplary gate signal adjustment circuit according to various embodiments.

FIG. 13 illustrates another exemplary gate signal adjustment circuit according to various embodiments. The circuit of FIG. 13 can adjust both the falling time and the rising time of a gate signal. In the example of FIG. 13, gate signal adjustment circuit 1310 can include multiple thin film transistors (TFTs) 1341, 1342, 1343, 1344, 1345, 1346 for receiving a gate drive signal from gate driver 1320, generating a gate signal, adjusting the gate signal, and outputting the adjusted gate signal. The circuit 1310 can also include control lines 1311, 1331 for receiving control signals from display driver 1330 to control the gate signal adjustment, input gate line 1322 for receiving a gate drive signal from the gate driver 1320, and output gate line 1312 for sending an adjusted gate signal to the display area (not shown).

TFT 1341 can be a p-type transistor with a gate terminal coupled to the input gate line 1322 to receive and invert a gate drive signal from the gate driver 1320, a source terminal coupled to a high voltage source Vgh from the gate driver, and a drain terminal coupled to the output gate line 1312 to output either an unadjusted or an adjusted gate signal.

TFT 1342 can be an n-type transistor with a gate terminal coupled to the input gate line 1322 to receive a gate drive signal from the gate driver 1320, a source terminal coupled to a low voltage source Vgl from the gate driver, and a drain terminal coupled to the output gate line 1312 to output a gate signal.

TFT 1343 can be an n-type transistor with a gate terminal coupled to the input gate line 1322 to receive a gate drive signal from the gate driver 1320, a source terminal coupled to a drain terminal of TFT 1344 to receive an adjustment signal, and a drain terminal coupled to the output gate line 1312 to output an adjustment signal for adjusting the outputted gate signal.

TFT 1344 can be an n-type transistor in series with TFT 1343 and can have a gate terminal coupled to the control line 1311 to receive a control signal from the display driver 1330, a source terminal coupled to the low voltage source Vgl from the gate driver 1320, and a drain terminal coupled to the source terminal of TFT 1343 to output an adjustment signal to TFT 1343 for adjusting the outputted gate signal.

TFT 1345 can be a p-type transistor with a gate terminal coupled to the input gate line 1322 to receive and invert a gate drive signal from the gate driver 1320, a source terminal coupled to a drain terminal of TFT 1346 to receive an adjustment signal, and a drain terminal coupled to the output gate line 1312 to output an adjustment signal for adjusting the outputted gate signal.

TFT 1346 can be a p-type transistor in series with TFT 1345 and can have a gate terminal coupled to the control line 1331 to receive a control signal from the display driver 1330, a source terminal coupled to the high voltage source Vgh from the gate driver 1320, and a drain terminal coupled to the source terminal of TFT 1345 to output an adjustment signal to TFT 1345 for adjusting the outputted gate signal.

The TFTs can be single-gate or multi-gate structures. Although the TFTs are described in particular p-type and n-type configurations, it is to be understood that other TFT type configurations are also possible according to the requirements of the display.

In some embodiments, control signals from the control lines 1311, 1331 can be digital signals. In some embodiments, the control signals can be analog, causing TFTs 1344, 1346 to operate like variable resistors.

Although TFT pairs 1343, 1344 and 1345, 1346 are shown in series here, it is to be understood that additional serial TFT pairs can be added in parallel with the shown pairs to provide additional adjustment signal options according to the requirements of the display.

During operation, the gate signal adjustment circuit can have various operating conditions. The operating conditions of the control lines for the circuit of FIG. 13 can be the same as shown in Table 2. For example, gate drive signal Vgin from the gate driver 1320 can be either high or low and the control signals Vc1, Vc2 from the display driver 1330 can be either high or low, if digital, or a range of low-to-high voltages, if analog. In a high state, the signal Vgin can actuate TFT 1342 and TFT 1343. Similarly, in a high state, the signal Vc1 can actuate TFT 1344. As a result, TFT 1342 can output low voltage Vgl as a gate signal, TFT1344 can output signal Vgl to TFT 1343, which can then output the signal Vgl onto the output gate line 1312 to interact with the signal Vgl transmitted by actuated TFT 1342, thereby forming the adjusted gate signal Vgout. The signal Vc2 can be in a high state to effectively turn off the upper portion of the circuit 1310. In this example, the falling time of the gate signal can be adjusted.

Conversely, in a low state, the signal Vgin can actuate TFT 1341 and TFT 1345. Similarly, in a low state, the signal Vc2 can actuate TFT 1346. As a result, TFT 1341 can output high voltage Vgh as a gate signal, TFT 1346 can output signal Vgh to TFT 1345, which can then output the signal Vgh onto the output gate line 1312 to interact with the signal Vgh transmitted by actuated TFT 1341, thereby forming the adjusted gate signal Vgout. The signal Vc1 can be in a high state to effectively turn off the lower portion of the circuit 1310. In this example, the rising time of the gate signal can be adjusted.

Figure 14:
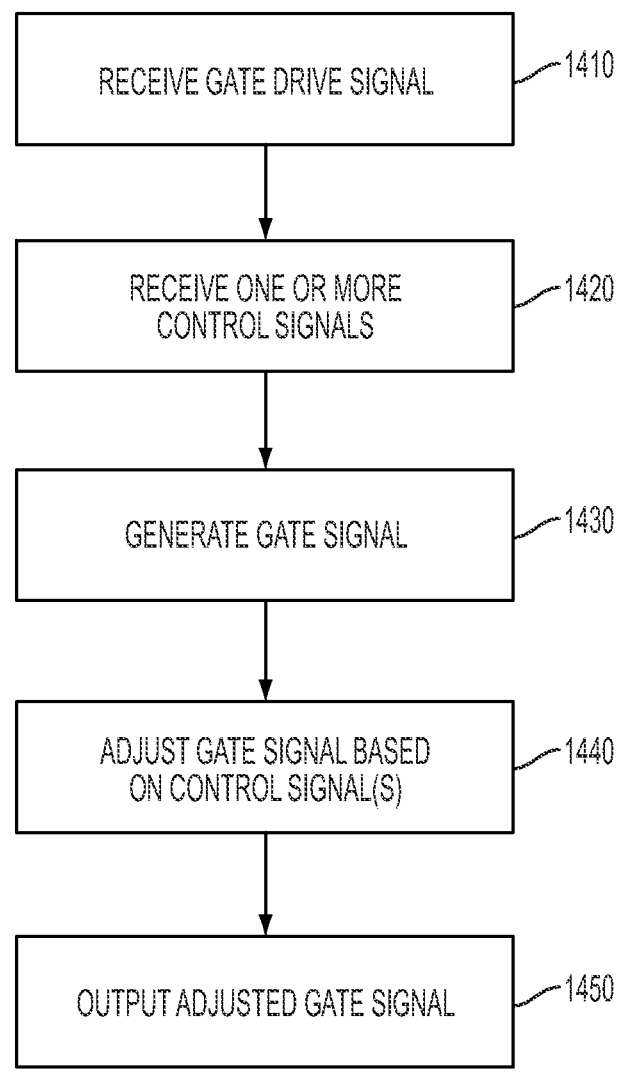
FIG. 14 illustrates an exemplary method for adjusting a gate signal of a display according to various embodiments.

FIG. 14 illustrates an exemplary method for adjusting a gate signal of a display according to various embodiments. In the example of FIG. 14, a gate signal adjustment circuit can receive a gate drive signal to drive the circuit (1410). The circuit can also receive one or more control signals to control adjustment to a gate signal (1420). In some embodiments, the control signals can be digital. In some embodiments, the control signals can be analog. The control signals can be adjustable according to the requirements of the display. The circuit can generate the gate signal (1430). The circuit can adjust the gate signal based on the control signals (1440). In some embodiments, the circuit can adjust the transition time of the gate signal in order to reduce crosstalk in the display, where the transition time can be the falling time, the rising time, or both of the gate signal. The adjustment can be to either speed up or slow down the transition time. The circuit can then output the adjusted gate signal to a display area of the display to drive the display area for displaying data (1450).

In some embodiments, generating and adjusting the gate signal can be done in a single action, such that the generated gate signal has adjusted transition time. In some embodiments, as illustrated here, the gate signal can be generated and then adjusted.

Figure 15:
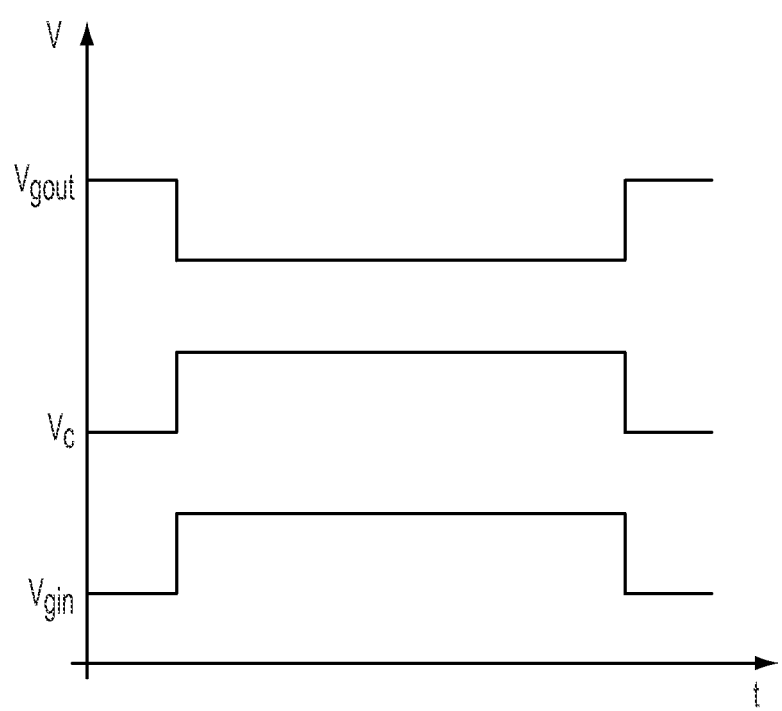
FIG. 15 illustrates an exemplary timing diagram of a gate signal adjustment circuit according to various embodiments.

FIG. 15 illustrates an exemplary timing diagram of a gate signal adjustment circuit according to various embodiments. This timing diagram is an example of the timing for the circuit of FIG. 3. In the example of FIG. 15, a gate signal adjustment circuit can receive a gate drive signal (Vgin) from a gate driver. The signal Vgin can go high when the display goes into update mode. The high signal Vgin can actuate one or more of the circuit's transistors to send a gate signal (Vgout) to a display area. The gate signal Vgout can be a low signal, comparable to a low voltage signal Vg1 from the gate driver. The circuit can also receive a control signal (Vc) from a display driver to adjust the gate signal. The signal Vc can actuate one or more of the circuit's transistors to adjust the falling time of the gate signal Vgout. The circuit can output the adjusted signal Vgout.

When the update mode is finished and the display goes back into quiet mode, the signal Vgin can go to low, the signal Vc to low, and the signal Vgout to high. During this time, the circuit can similarly adjust the rising time of the gate signal Vgout, if desired.

Figure 16:
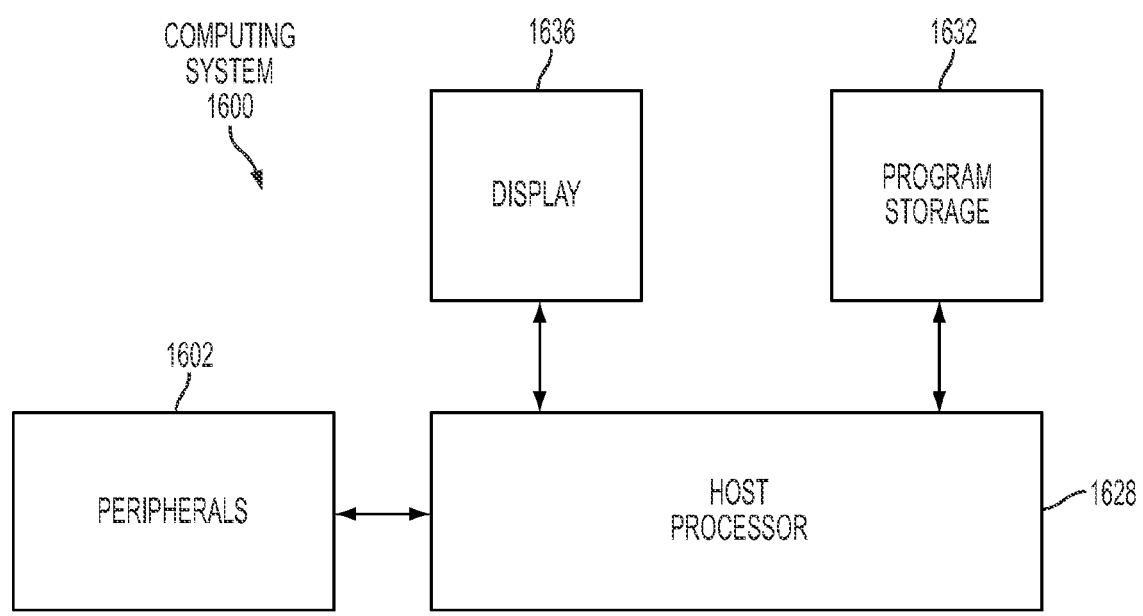
FIG. 16 illustrates an exemplary computing system having a display with a gate signal adjustment circuit according to various embodiments.

FIG. 16 illustrates an exemplary computing system 1600 that can incorporate a display having a gate signal adjustment circuit according to various embodiments described herein. In the example of FIG. 16, computing system 1600 can include display 1636 to display graphics, text, images, and the like. The display 1636 can include a gate signal adjustment circuit (not shown) for adjusting a gate signal according to various embodiments. The display 1636 can also include circuitry to generate and transmit signals to a display area to drive the display; circuitry to communicate with host processor 1628 to receive data to be displayed and to receive drive signals to drive the display; and circuitry to access random access memory (RAM).

The computing system can also include one or more peripherals 1602, the host processor 1628, and the program storage 1632.

The peripherals 1602 can include, but are not limited to, RAM or other types of memory or storage, watchdog timers, and the like.

The host processor 1628 can transmit drive signals to the display 1636 to cause a display driver in the display to generate control signals for the gate signal adjustment circuits to adjust the gate signals for the display. The drive signals can cause the display driver to adjust the voltage of the control signals so as to adjust the transition time of the gate signal. The drive signals can also cause the display driver to initiate transmission of the control signals to the gate signal adjustment circuits. Alternatively, the host processor 1628 can generate the control signals itself (independent of the display driver) and transmit the control signals to the gate signal adjustment circuits directly. To perform these actions, the host processor 1628 can execute instructions stored in a computer readable storage medium to transmit the drive signals or to generate and transmit the control signals. In the context of this document, a "computer readable storage medium" can be any non-transitory medium that can contain or store the program for use by or in connection with the instruction execution system, apparatus, or device. The computer readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The host processor 1628 can also receive outputs from the display 1636 and perform actions based on the outputs that can include, but are not limited to, moving an object such as a cursor or pointer, scrolling or panning, adjusting control settings, opening a file or document, viewing a menu, making a selection, executing instructions, operating a peripheral device coupled to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. The host processor 1628 can also perform additional functions that may not be related to display processing, and can be coupled to the program storage 1632.

One or more of the actions described above, can be performed, for example, by firmware stored in memory (e.g., one of the peripherals) or stored in the program storage 1632 and executed by the host processor 1628, as described previously. The firmware can also be stored and/or transported within any non-transitory computer readable storage medium for use by or in connection with an instruction execution system, apparatus, or device, such as a computer-based system, processor-containing system, or other system that can fetch the instructions from the instruction execution system, apparatus, or device and execute the instructions.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

Figure 17:
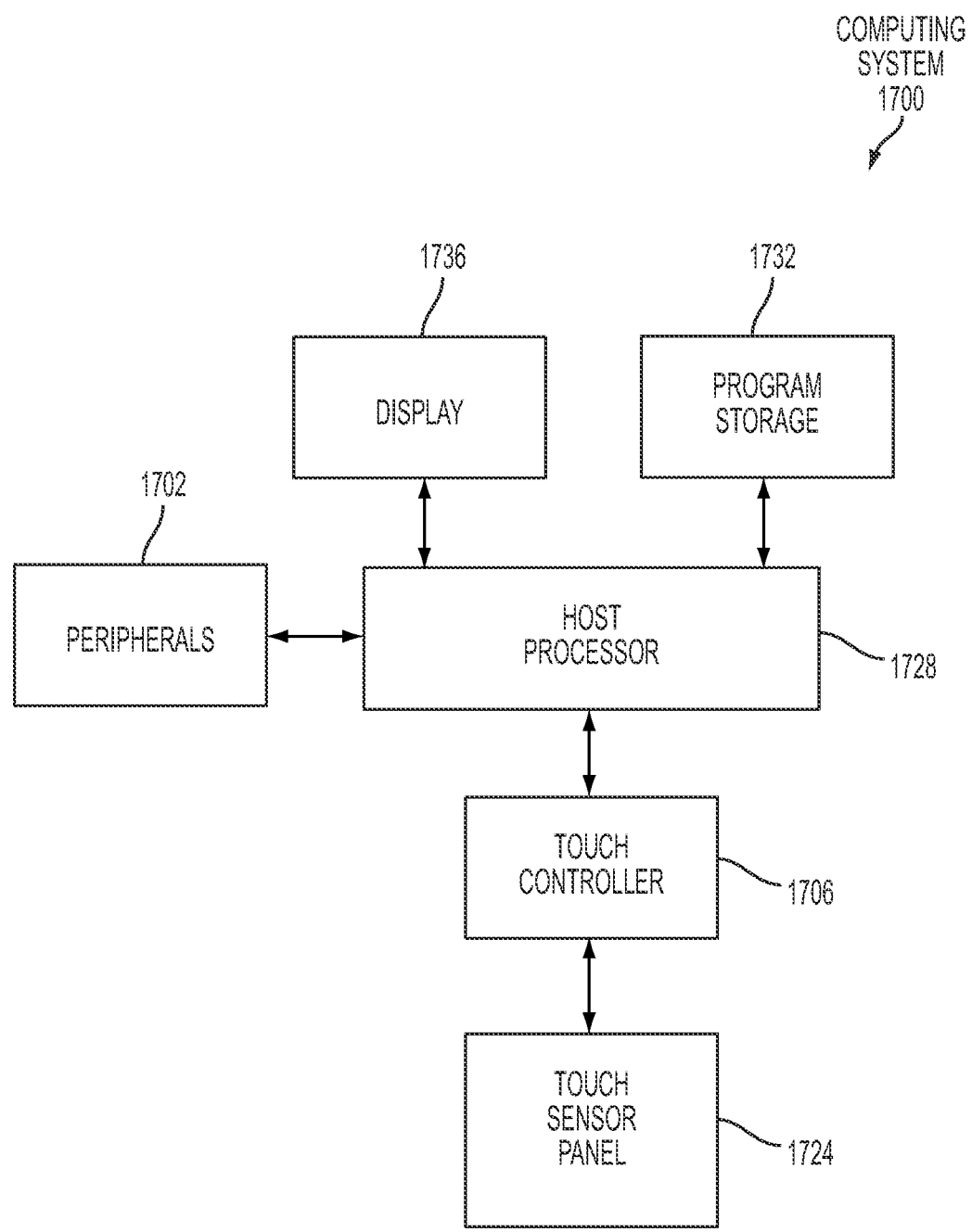
FIG. 17 illustrates another exemplary computing system having a display with a gate signal adjustment circuit according to various embodiments.

FIG. 17 illustrates another exemplary computing system 1700 that can incorporate a display having a gate signal adjustment circuit according to various embodiments described herein. In the example of FIG. 17, computing system 1700 can include display 1736, one or more peripherals 1702, host processor 1728, and program storage 1732, similar to those described in FIG. 16. Additionally, the computing system can include touch sensor panel 1724 having multiple electrodes for detecting a touch at the panel, where the electrodes can be driven by drive signals, and for transmitting touch signals indicative of a detected touch to touch controller 1706.

The touch controller 1706 can include various touch circuitry for driving the touch panel and processing the touch signals. For example, the controller 1706 can include circuitry to receive the touch signals and other signals from other sensors; generate and transmit the drive signals to the touch panel to drive the panel; access RAM; and autonomously read from and control touch sensing channels.

In some embodiments, the host processor 1728 can be a separate component from the controller 1706, as shown. In other embodiments, the host processor 1728 can be included as part of the controller 1706. In still other embodiments, the functions of the host processor 1728 can be performed by the controller 1706 and/or distributed among other components of the computing system.

It is to be understood that the computing systems of FIGS. 16 and 17 are not limited to the components and configurations shown, but can include other and/or additional components in various configurations according to various embodiments.

Figure 18:
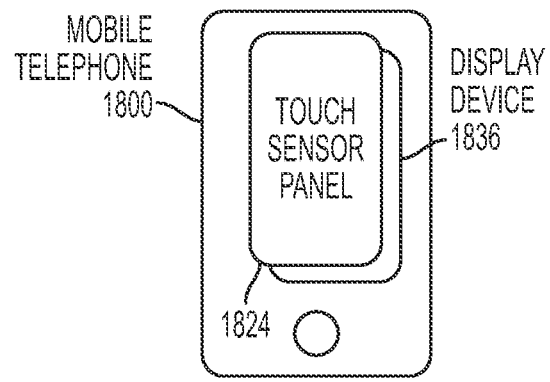
FIG. 18 illustrates an exemplary mobile telephone having a gate signal adjustment circuit according to various embodiments.

FIG. 18 illustrates an exemplary mobile telephone 1800 that can include touch panel 1824, display device 1836, and other computing system blocks, where the display device can include a gate signal adjustment circuit according to various embodiments.

Figure 19:
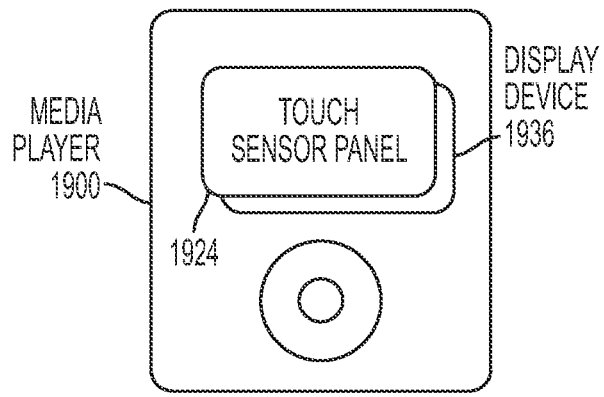
FIG. 19 illustrates an exemplary digital media player having a gate signal adjustment circuit according to various embodiments.

FIG. 19 illustrates an exemplary digital media player 1900 that can include touch panel 1924, display device 1936, and other computing system blocks, where the display device can include a gate signal adjustment circuit according to various embodiments.

Figure 20:
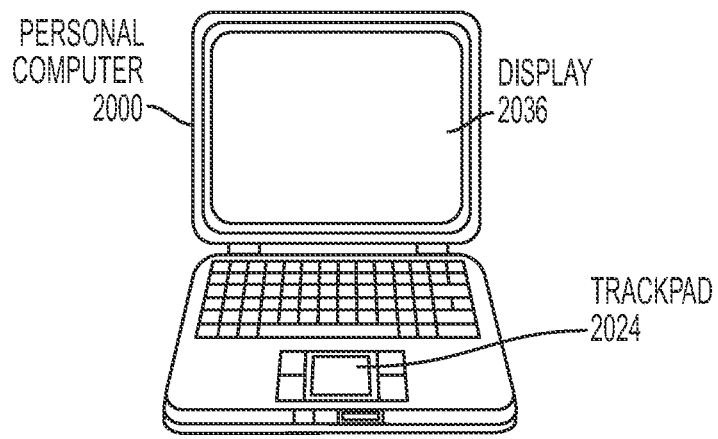
FIG. 20 illustrates an exemplary personal computer having a gate signal adjustment circuit according to various embodiments.

FIG. 20 illustrates an exemplary personal computer 2000 that can include touch pad 2024, display 2036, and other computing system blocks, where the display can include a gate signal adjustment circuit according to various embodiments.

The mobile telephone, media player, and personal computer of FIGS. 18 through 20 can improve device performance and display quality by utilizing a gate signal adjustment circuit according to various embodiments.

Although embodiments have been fully described with reference to the accompanying drawings, it is to be noted that various changes and modifications will become apparent to those skilled in the art. Such changes and modifications are to be understood as being included within the scope of the various embodiments as defined by the appended claims.

What is claimed is:

1. A circuit comprising:
    a control line from a display driver that transmits an adjustable voltage and is directly connected to a gate of one or more adjustment transistors; and
    a timing circuit comprising one or more output transistors and the one or more adjustment transistors coupled together,
    the one or more output transistors directly connected to an output signal to transmit the output signal from the timing circuit, and
    the one or more adjustment transistors adjusting at least one of a rising time and a falling time of the output signal by receiving the adjustable voltage to couple one or more adjustment signals to the output signal through a source and a drain of the one or more adjustment transistors.

2. The circuit of claim 1, wherein the timing circuit comprises:
    a pair of the one or more output transistors coupled together to transmit the output signal.

3. The circuit of claim 2, wherein the timing circuit comprises:
    a first adjustment transistor coupled to the pair to transmit an adjustment signal to the pair for adjusting the output signal.

4. The circuit of claim 1, wherein the timing circuit comprises:
    a first adjustment transistor coupled to the output signal; and
    a second adjustment transistor that receives the adjustable voltage and coupled to the first transistor to transmit an adjustment signal to the first adjustment transistor for adjusting the output signal.

5. The circuit of claim 2, wherein the timing circuit comprises:
    an inverter that inverts the adjustable voltage so as to form an inverted adjustable voltage;
    a first adjustment transistor coupled to the output signal;
    a second adjustment transistor that receives the inverted adjustable voltage and coupled to the pair to transmit a first adjustment signal to the pair for adjusting the output signal; and
    a third adjustment transistor that receives the adjustable voltage and coupled to the first adjustment transistor to transmit a second adjustment signal to the first adjustment transistor for adjusting the output signal.

6. The circuit of claim 2, wherein the timing circuit comprises:
    an inverter that inverts the adjustable voltage so as to form an inverted adjustable voltage, wherein the one or more adjustment transistors includes a first adjustment transistor, a second adjustment transistor, and a third adjustment transistor,
    the first adjustment transistor coupled to the pair to transmit a first adjustment signal to the pair for adjusting the output signal,
    the second adjustment transistor receives the inverted adjustable voltage and is coupled to the pair to transmit a second adjustment signal to the pair for adjusting the output signal, and
    the third adjustment transistor receives the adjustable voltage and is coupled to the first transistor to transmit a third adjustment signal to the first adjustment transistor for forming the first adjustment signal.

7. The circuit of claim 2, wherein the timing circuit comprises:
    a first adjustment transistor coupled to the pair to transmit a first adjustment signal to the pair for adjusting the output signal;
    a second adjustment transistor coupled to the pair to transmit a second adjustment signal to the pair for adjusting the output signal; and
    a third adjustment transistor that receives the adjustable voltage and is coupled to the first adjustment transistor to transmit a third adjustment signal to the first adjustment transistor for forming the first adjustment signal.

8. The circuit of claim 1, wherein the timing circuit adjusts the falling time.

9. A circuit comprising:
multiple control lines from a display driver that transmit control voltages and are directly connected to a gate of one or more adjustment transistors; and
a timing circuit comprising one or more output transistors and the one or more adjustment transistors coupled together,
the one or more output transistors directly connected to an output signal to transmit the output signal from the timing circuit, and
the one or more adjustment transistors receiving one of the control voltages so as to adjust a transition time of the output signal based on the one control voltage by coupling an adjustment signal to the output signal through a source and a drain of the one or more adjustment transistors, the transition time being at least one of a rising time and a falling time.

10. The circuit of claim 9, wherein the timing circuit comprises:
a pair of the one or more output transistors coupled together to transmit the output signal;
a first adjustment transistor coupled to a first control line to receive a first control voltage and coupled to the pair to transmit a first adjustment signal to the pair for adjusting the transition time of the output signal; and
a second adjustment transistor coupled to a second control line to receive a second control voltage and coupled to the pair to transmit a second adjustment signal to the pair for adjusting the transition time of the output signal.

11. The circuit of claim 9, wherein the timing circuit comprises:
a pair of the one or more output transistors coupled together to transmit the output signal;
a first adjustment transistor coupled to a first control line to receive a first control voltage and coupled to the output signal for adjusting the transition time of the output signal; and
a second adjustment transistor coupled to a second control line to receive a second control voltage and coupled to the output signal for adjusting the transition time of the output signal.

12. The circuit of claim 9, wherein the timing circuit comprises:
a pair of the one or more output transistors coupled together to transmit the output signal
a first adjustment transistor coupled to the output signal for adjusting the transition time of the output signal;
a second adjustment transistor coupled to a first control line to receive a first control voltage and coupled to the first adjustment transistor to transmit a first adjustment signal to the first adjustment transistor for adjusting the transition time of the output signal; and
a third adjustment transistor coupled to a second control line to receive a second control voltage and coupled to the first adjustment transistor to transmit a second adjustment signal to the first adjustment transistor for adjusting the transition time of the output signal.

13. The circuit of claim 9, wherein the timing circuit comprises:
a pair of the one or more output transistors coupled together to transmit the output signal;
a first adjustment transistor coupled to the output signal for adjusting the transition time of the output signal;
a second adjustment transistor coupled to the output signal for adjusting the transition time of the output signal;
a third adjustment transistor coupled to a first control line to receive a first control voltage and coupled to the first adjustment transistor to transmit a first adjustment signal to the first adjustment transistor for adjusting the transition time of the output signal; and
a fourth adjustment transistor coupled to a second control line to receive a second control voltage and coupled to the second adjustment transistor to transmit a second adjustment signal to the second adjustment transistor for adjusting the transition time of the output signal.

14. The circuit of claim 9, wherein the control lines transmit different control voltages.

15. The circuit of claim 9, wherein at least two of the one or more adjustment transistors are different sizes.

16. A display comprising:
a gate signal adjustment circuit that outputs a gate signal by transmitting the gate signal through one or more output transistors, the one or more output transistors directly connected to the gate signal, and adjusts at least one of a rising time and a falling time of the gate signal according to a control voltage by coupling one or more adjustment signals through a source and a drain of the one or more adjustment transistors;
a gate driver that drives the circuit; and
a display driver that sends the control voltage to a gate of the one or more adjustment transistors.

17. The display of claim 16, wherein the circuit comprises multiple components, one set of the components transmits the gate signal and another set of the components transmits an adjustment signal for adjusting the gate signal, the adjusting comprising adjusting the at least one of a rising time and a falling time of the gate signal.

18. The display of claim 16, comprising:
a second gate signal adjustment circuit that adjusts a second gate signal according to a second control voltage, wherein the gate signal adjustment circuit and the second gate signal adjustment circuit are disposed on opposite sides of the display.

19. The display of claim 16 incorporated into at least one of a mobile phone, a media player, or a computer.

20. A gate signal adjustment circuit for a display comprising:
at least one control input from a display driver;
at least one gate signal output; and
multiple transistors that adjust a gate signal and comprised of one or more output transistors and one or more adjustment transistors,
the one or more output transistors directly connected to the at least one gate signal output to transmit the adjusted gate signal, and
the one or more adjustment transistors receiving at least one control signal through the at least one control input directly connected to a gate of the one or more adjustment transistors so as to adjust at least one of a rising time and a falling time of the gate signal by coupling one or more adjustment signals to the gate signal through a source and a drain of the one or more adjustment transistors.

21. The circuit of claim 20, wherein at least some of the transistors form a falling time circuit that adjusts the falling time of the gate signal so as to form an adjusted gate signal.

22. The circuit of claim 20, wherein at least some of the transistors form a rising time circuit that adjusts the rising time of the gate signal so as to form an adjusted gate signal.

23. A method for adjusting a gate signal at a display comprising:
- receiving at least one control signal from a display driver at a gate of one or more transistors;
- adjusting a transition time of a gate signal according to the received at least one control signal by coupling one or more adjustment signals to the gate signal through a source and a drain of the one or more transistors, the transition time being at least one of a rising time and a falling time; and
- outputting the adjusted gate signal through one or more output transistors.

24. The method of claim 23, wherein adjusting the transition time comprises:
- actuating at least one transistor of the display to output the gate signal;
- actuating at least another transistor of the display with the at least one control signal, the at least another transistor being coupled to the at least one transistor; and
- adjusting the transition time of the gate signal with an output of the actuated at least another transistor.

25. The method of claim 23, wherein receiving at least one control signal comprises: receiving at least one of a digital signal or an analog signal.

* * * * *